(12) United States Patent
Tanzawa

(10) Patent No.: US 10,521,130 B2
(45) Date of Patent: Dec. 31, 2019

(54) MEMORY DEVICE INCLUDING MIXED NON-VOLATILE MEMORY CELL TYPES

(71) Applicant: Micron Technology, Inc., Boise, ID (US)

(72) Inventor: Toru Tanzawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/197,208

(22) Filed: Nov. 20, 2018

(65) Prior Publication Data

US 2019/0087103 A1 Mar. 21, 2019

Related U.S. Application Data

(63) Continuation of application No. 15/408,671, filed on Jan. 18, 2017, now Pat. No. 10,203,885.

(51) Int. Cl.
| | |
|---|---|
| G11C 11/00 | (2006.01) |
| G06F 3/06 | (2006.01) |
| G11C 16/04 | (2006.01) |
| G11C 11/56 | (2006.01) |
| G11C 16/34 | (2006.01) |
| H01L 27/11524 | (2017.01) |

(Continued)

(52) U.S. Cl.
CPC ............ *G06F 3/0613* (2013.01); *G06F 3/064* (2013.01); *G06F 3/0625* (2013.01); *G06F 3/0656* (2013.01); *G06F 3/0679* (2013.01); *G11C 11/005* (2013.01); *G11C 11/5628* (2013.01); *G11C 11/5635* (2013.01); *G11C 11/5642* (2013.01); *G11C 11/5657* (2013.01); *G11C 11/5671* (2013.01); *G11C 16/0483* (2013.01); *G11C 16/3459* (2013.01); *H01L 27/1157* (2013.01); *H01L 27/1159* (2013.01); *H01L 27/11524* (2013.01); *H01L 27/11556* (2013.01); *H01L 27/11582* (2013.01); *H01L 27/11597* (2013.01); *H01L 29/516* (2013.01)

(58) Field of Classification Search
CPC .............. G11C 11/005; G11C 11/5642; G11C 16/0408
USPC ......................................... 365/185.11, 185.13
See application file for complete search history.

(56) References Cited

U.S. PATENT DOCUMENTS

| | | | |
|---|---|---|---|
| 7,898,859 B2 | 3/2011 | Ghodsi | |
| 2007/0025151 A1* | 2/2007 | Lee ...................... | G11C 11/5621 365/185.11 |

(Continued)

OTHER PUBLICATIONS

"U.S. Appl. No. 15/408,671, Non Final Office Action dated Feb. 8, 2018", 11 pgs.

(Continued)

*Primary Examiner* — Han Yang
(74) *Attorney, Agent, or Firm* — Schwegman Lundberg & Woessner, P.A.

(57) ABSTRACT

Some embodiments include apparatuses, and methods of forming and operating the apparatuses. Some of the apparatuses include a conductive line, non-volatile memory cells of a first memory cell type, the non-volatile memory cells coupled in series among each other, and an additional non-volatile memory cell of a second memory cell type coupled to the conductive line and coupled in series with the non-volatile memory cells of the first memory cell type. The second memory cell type is different from the first memory cell type.

20 Claims, 14 Drawing Sheets

(51) Int. Cl.
*H01L 27/11556* (2017.01)
*H01L 27/1157* (2017.01)
*H01L 27/11582* (2017.01)
*H01L 29/51* (2006.01)
*H01L 27/1159* (2017.01)
*H01L 27/11597* (2017.01)

(56) References Cited

U.S. PATENT DOCUMENTS

| | | |
|---|---|---|
| 2009/0168513 A1 | 7/2009 | Tanaka |
| 2011/0019470 A1 | 1/2011 | Shibata et al. |
| 2011/0222342 A1* | 9/2011 | Yoon .................. G11C 11/56 |
| | | 365/185.03 |
| 2014/0047163 A1 | 2/2014 | Kwak |
| 2015/0279472 A1 | 10/2015 | Jones |
| 2018/0203613 A1 | 7/2018 | Tanzawa |

OTHER PUBLICATIONS

"U.S. Appl. No. 15/408,671, Notice of Allowance dated Aug. 30, 2018", 11 pgs.

"U.S. Appl. No. 15/408,671, Preliminary Amendment filed Nov. 19, 2018", 5 pgs.

"U.S. Appl. No. 15/408,671, Response filed Jun. 8, 2018 to Non Final Office Action dated Feb. 8, 2018", 9 pgs.

"U.S. Appl. No. 15/408,671, Response filed Oct. 27, 2017 to Restriction Requirement dated Aug. 29, 2017", 5 pgs.

"U.S. Appl. No. 15/408,671, Restriction Requirement dated Aug. 29, 2017", 6 pgs.

Choi, Jungdal, "3D Approaches for Non-volatile Memor", Symposium on VLSI Technology Digest of Technical Papers, (2011), 178-179.

Jang, J., et al., "Vertical cell array using TCAT(Terabit Cell Array Transistor) technology for ultra high density NAND flash memory", Symposium on VLSI Technology, (2009), 192-193.

Katsumata, R., et al., "Pipe-shaped BiCS flash memory with 16 stacked layers and multilevel-cell operation for ultra high density storage devices", Symposium on VLSI Technology, (Jun. 2009), 136-37.

Kim, Jiyoung, et al., "Novel Vertical-Stacked-Array-Transistor (VSAT) for ultra-high-density and cost-effective NAND Flash memory devices and SSD (Solid State Drive)", Symposium on VLSI Technology Digest of Technical Papers, (2009), 186-187.

Kim, W., et al., "Multi-layered Vertical Gate NAND Flash overcoming stacking limit for terabit density storage", Symposium on VLSI Technology, (2009), 188-89.

Park, Ki-Tae, et al., "Three-Dimensional 128Gb MLC Vertical NAND Flash-Memory with 24-WL Stacked Layers and 50MB/s High-Speed Programming", IEEE International Solid-State Circuits Conference, (2014), 334-335.

Sakui, Koji, et al., "Design Impacts on NAND Flash Memory Core Circuits with Vertical MOSFETs", IEEE 978-1-4244-7668-8/10, Center for Interdisciplinary Research, Tohoku University, JST-CREST, (2010), 84-87.

* cited by examiner

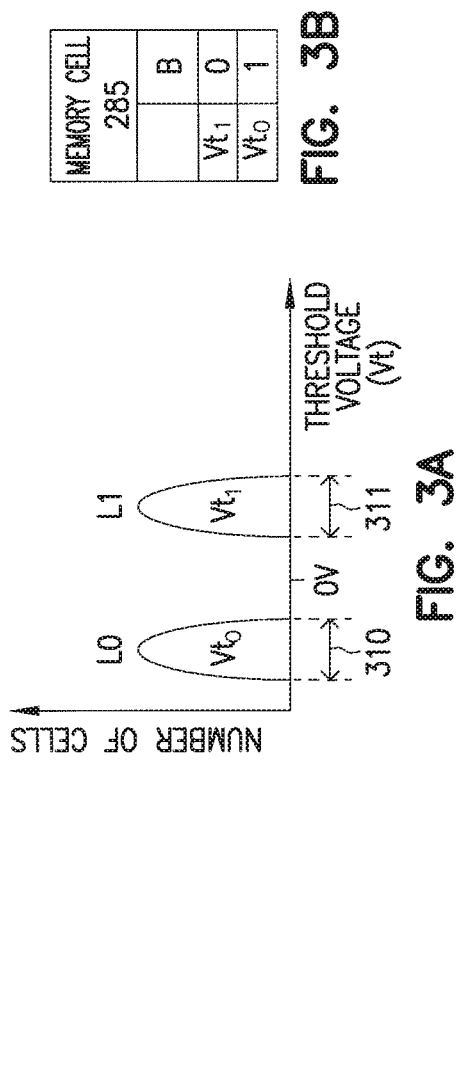
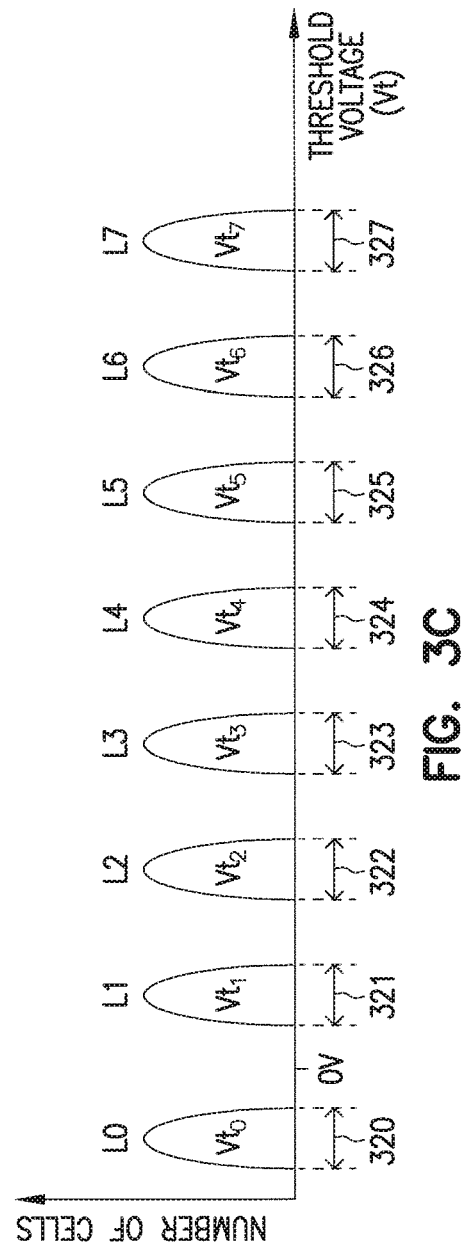

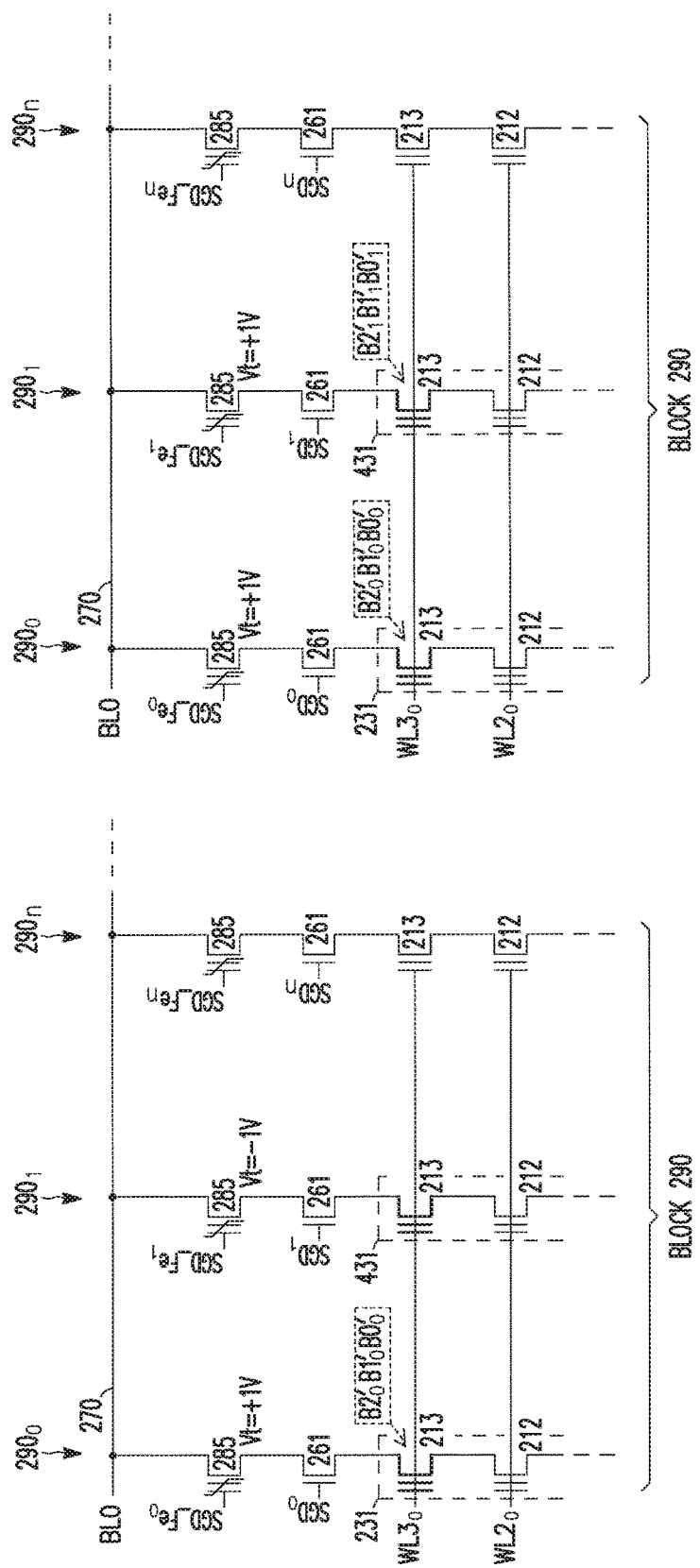

| PROGRAM LOOP NUMBER | MEMORY CELL BLOCK 290 | | | | |
|---|---|---|---|---|---|
| | 1 | 2 | 3 | 4 | 5 |
| BL0 | 0V | 0V | 0V | 0V | 0V |
| SGD_Fe$_0$ | 0V | 0V | 0V | 0V | 0V |
| SGD_Fe$_1$ | 0V | 0V | 0V | 0V | 0V |
| SGD$_0$ | +3V | +3V | +3V | +3V | +3V |
| SGD$_1$ | +3V | +3V | +3V | +3V | +3V |
| Vt (CELL 285, SGD_Fe$_0$) | -1V | -1V | -1V | +1V | +1V |
| Vt (CELL 285, SGD_Fe$_1$) | -1V | -1V | -1V | -1V | +1V |
| WL0$_0$, WL1$_0$, WL2$_0$ | 10V | 10V | 10V | 10V | 10V |
| WL3$_0$ | 17V | 18V | 19V | 20V | 21V |
| Vt$_{213\_231}$ (CELL 213, STRING 231) TARGET=1V | -1V | 0V | 1V | 1V | 1V |
| Vt$_{213\_431}$ (CELL 213, STRING 431) TARGET=2V | -1V | 0V | 1V | 2V | 2V |

500
FIG. 5

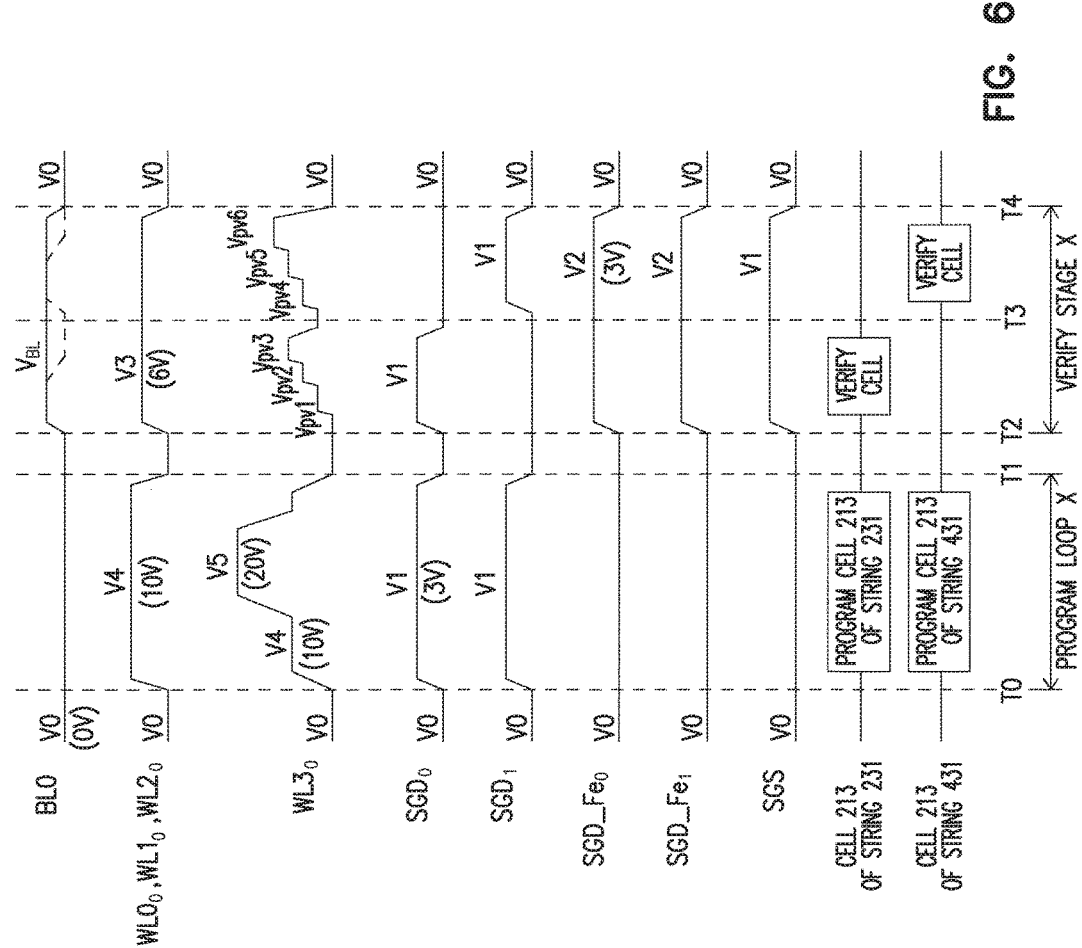

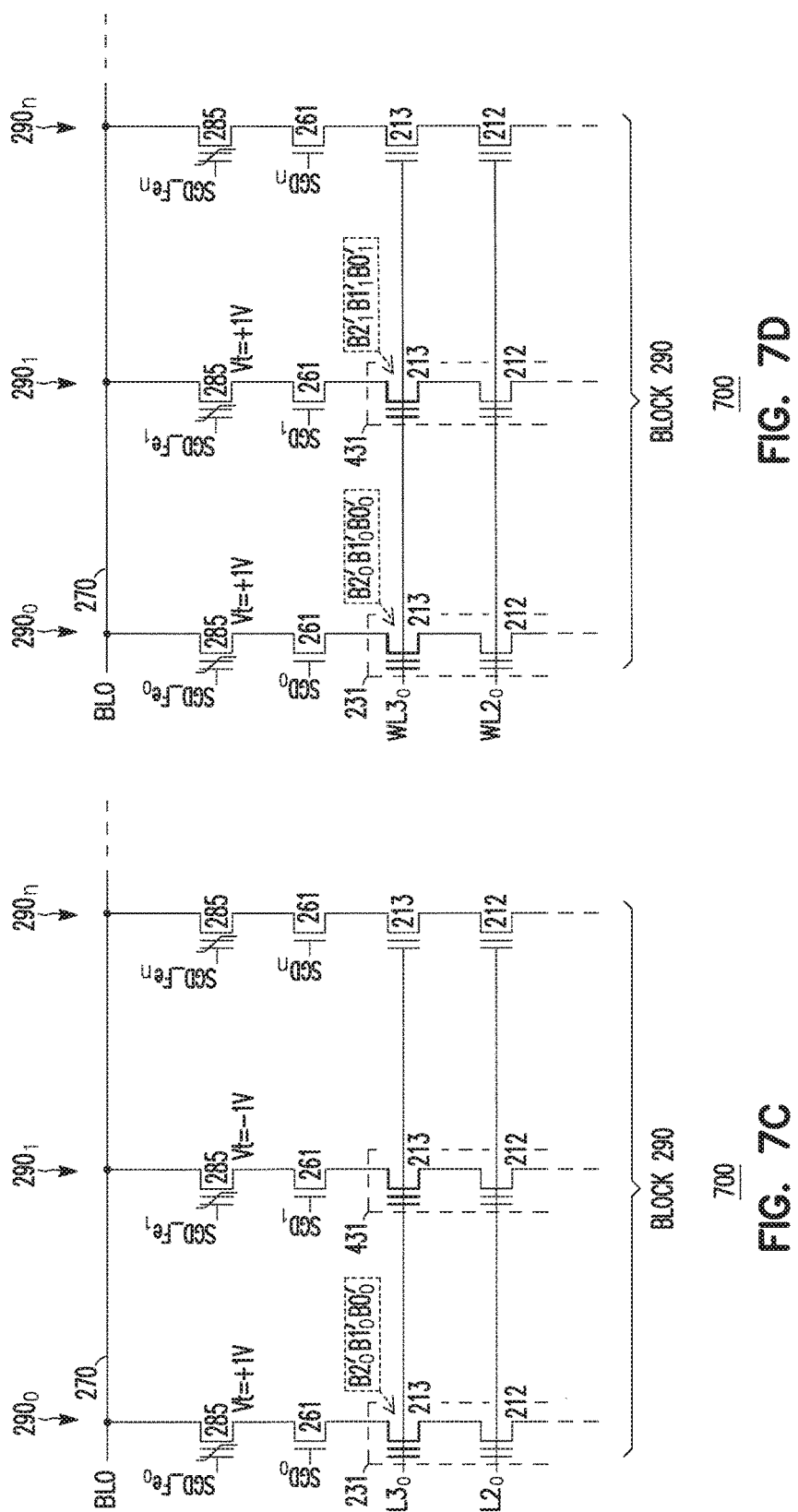

MEMORY DEVICE INCLUDING MIXED NON-VOLATILE MEMORY CELL TYPES

BACKGROUND

Memory devices are widely used in computers and many other electronic items to store information. Some conventional memory devices have a relatively high density to meet demand for storing a large amount of information. However, many such conventional memory devices may consume a relatively high amount of energy, thereby making them unfavorable for use in some electronic devices and systems.

BRIEF DESCRIPTION OF THE DRAWINGS

FIG. 3A shows an example of threshold voltage value ranges of threshold voltages of some of the memory cells of the memory device of FIG. 2B, according to some embodiments described herein.

FIG. 3B is an example chart showing threshold voltages and corresponding values of a bit, according to some embodiments described herein.

FIG. 3C shows an example of threshold voltage value ranges of threshold voltages of other memory cells of the memory device of FIG. 2B, according to some embodiments described herein.

FIG. 3D is an example chart showing threshold voltages and corresponding values of a combination of bits, according to some embodiments described herein.

FIG. 4C shows a portion of the memory device of FIG. 4B including information stored in a selected memory cell of the selected block during the example write operation of the memory device, according to some embodiments described herein.

FIG. 4D shows a portion of the memory device of FIG. 4B including information stored in another selected memory cell of the selected block during the example write operation of the memory device, according to some embodiments described herein.

FIG. 5 is a chart showing example values for some of the signals and threshold voltages of a selected block of the memory device of FIG. 4A, FIG. 4B, FIG. 4C, and FIG. 4D during an example write operation, according to some embodiments described herein.

FIG. 6 shows example waveforms of some of the signals of a memory block of the memory device of FIG. 4A, FIG. 4B, and FIG. 4C during a program loop and a verify stage, according to some embodiments described herein.

FIG. 7A through FIG. 7D show a portion of another memory device including information to be stored in a selected block of the memory device, according to some embodiments described herein.

DETAILED DESCRIPTION

Figure 1:
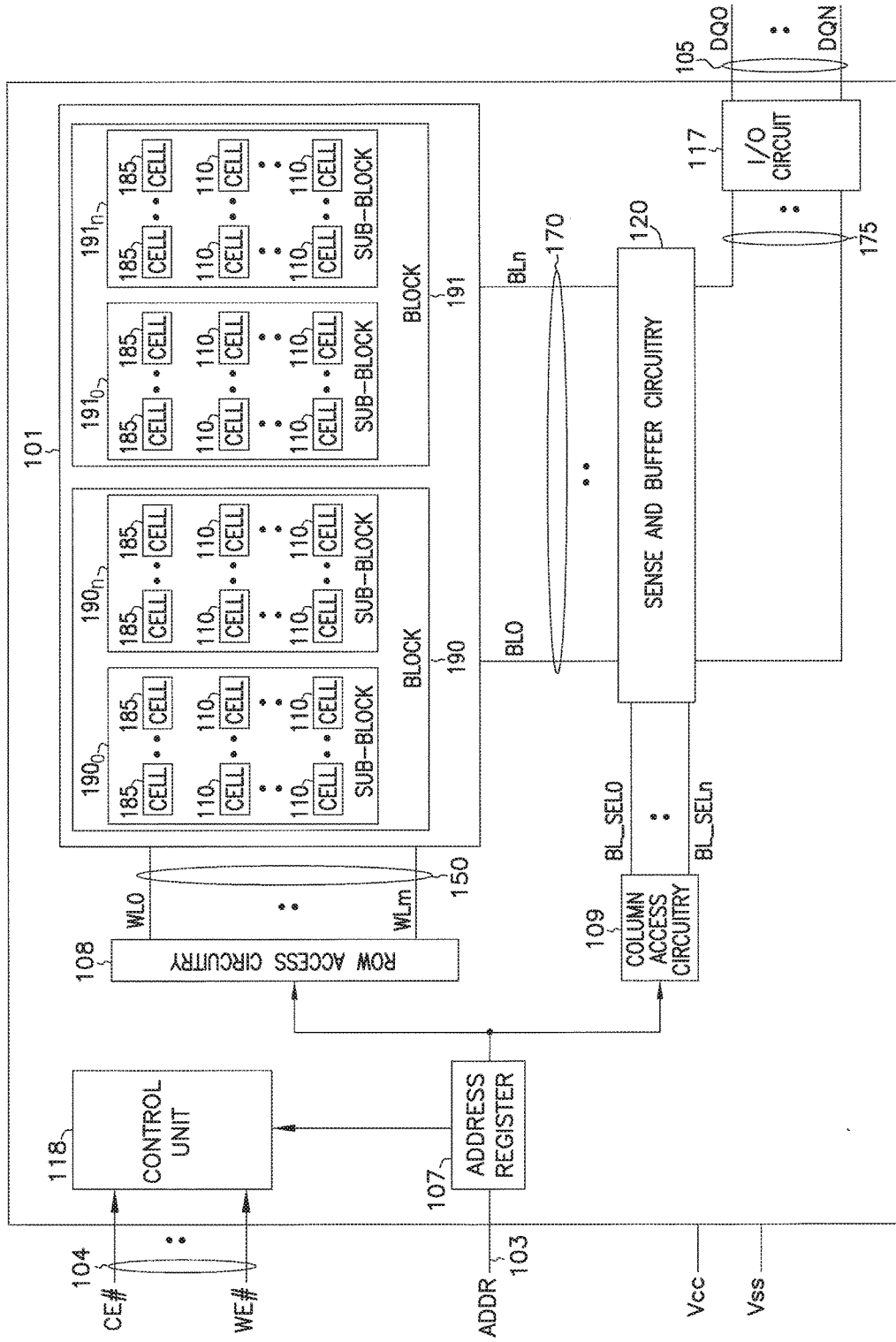
FIG. 1 shows a block diagram of an apparatus in the form of a memory device including non-volatile memory cells having different non-volatile memory cell types integrated in the same integrated circuit (IC) chip, according to some embodiments described herein.

FIG. 1 shows a block diagram of an apparatus in the form of a memory device 100 including non-volatile memory cells having mixed memory cell types integrated in the same integrated circuit (IC) chip, according to some embodiments described herein. Memory device 100 can include a memory array (or multiple memory arrays) 101 containing memory cells 110 and 185. In the physical structure of memory device 100, memory cells 110 and 185 can be arranged vertically (e.g., stacked over each other) over a substrate of memory device 100 (e.g., a semiconductor substrate of an IC chip that includes memory device 100). Memory cells 110 and 185 can include non-volatile cells. Memory cells 110 and 185 can have different non-volatile memory cell types. For example, memory cells 110 can include floating gate memory cells, charge trap memory cells, or other types of non-volatile memory cells. Memory cells 185 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 1, memory cells 110 and 185 can be arranged in blocks (memory cell blocks), such as blocks 190 and 191. Each of blocks 190 and 191 can include sub-blocks. For example, block 190 can include sub-blocks $190_0$ and $190_n$, and block 191 can include sub-blocks $191_0$ and $191_n$. Each of sub-blocks $190_0$, $190_n$, $191_0$, and $191_n$ can include a combination of memory cells 110 and 185. FIG. 1 shows memory device 100 having two blocks 190 and 191 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access sub-blocks $190_0$, $190n$, $191_0$, and $191_n$ of blocks 190 and 191 and data lines 170 to selectively exchange information (e.g., data) with memory cells 110 of blocks 190 and 191.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 110 of which sub-blocks of blocks 190 and 191 are to be accessed during a memory operation. Memory device 100 can perform a read operation to read (e.g., sense) information (e.g., previously stored information) in memory cells 110, or a write (e.g., program) operation to store (e.g., program) information in memory cells 110. Memory device 100 can use data lines 170 associated with signals BL0 through BLn to provide information to be stored in memory cells 110 or obtain information read (e.g., sensed) from memory cells 110. Memory device 100 can also perform an erase operation to erase information from some or all of memory cells 110 of blocks 190 and 191.

Memory device 100 can include a control unit 118 (which can include components such as a state machine (e.g., finite state machine), register circuits, and other components) configured to control memory operations (e.g., read, write, and erase operations) of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 110 (e.g., during a read operation) of blocks 190 and 191 and provide the value of the information to lines (e.g., global data lines) 175. Sense and buffer circuitry 120 can also can be configured to use signals on lines 175 to determine the value of information to be stored (e.g., programmed) in memory cells 110 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 110 of blocks 190 and 191 and lines (e.g., I/O lines) 105. Signals DQ0 through DQN on lines 105 can represent information read from or stored in memory cells 110 of blocks 190 and 191. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 110 can be programmed to store information representing a value of a fraction of a bit, a value of a single bit, or a value of multiple bits such as two, three, four, or another number of bits. For example, each of memory cells 110 can be programmed to store information representing a binary value "0" or "1" of a single bit. The single bit per cell is sometimes called a single-level cell. In another example, each of memory cells 110 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, such that memory cells 110 and 185 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 100 may include other components, several of which are not shown in FIG. 1 so as not to obscure the example embodiments described herein.

In memory device 100, memory cells 110 can be configured to store information (e.g., user data). Memory cells 185 may not be configured to permanently store information such as user information, but they may be used by memory device 100 as temporary storage cells during an operation (e.g., a write operation) of storing information (e.g., user data) in memory cells 110 in order to improve operations of memory device 100.

At least a portion of memory device 100 can include structures and perform operations similar to or identical to the structures and operations of any of the memory devices described below with reference to FIG. 2 through FIG. 9. Structuring and operating a memory device (e.g., memory device 100) as described herein allows the memory device to have improvements over some conventional memory devices. Such improvements include a lower energy to store a bit of information in memory cells (e.g., memory cells 110) of the memory device in comparison with some conventional memory devices, and a higher program throughput for the memory device in comparison with some conventional memory devices. This allows memory device 100 to be suitable for different electronic devices and systems.

Figure 2A:
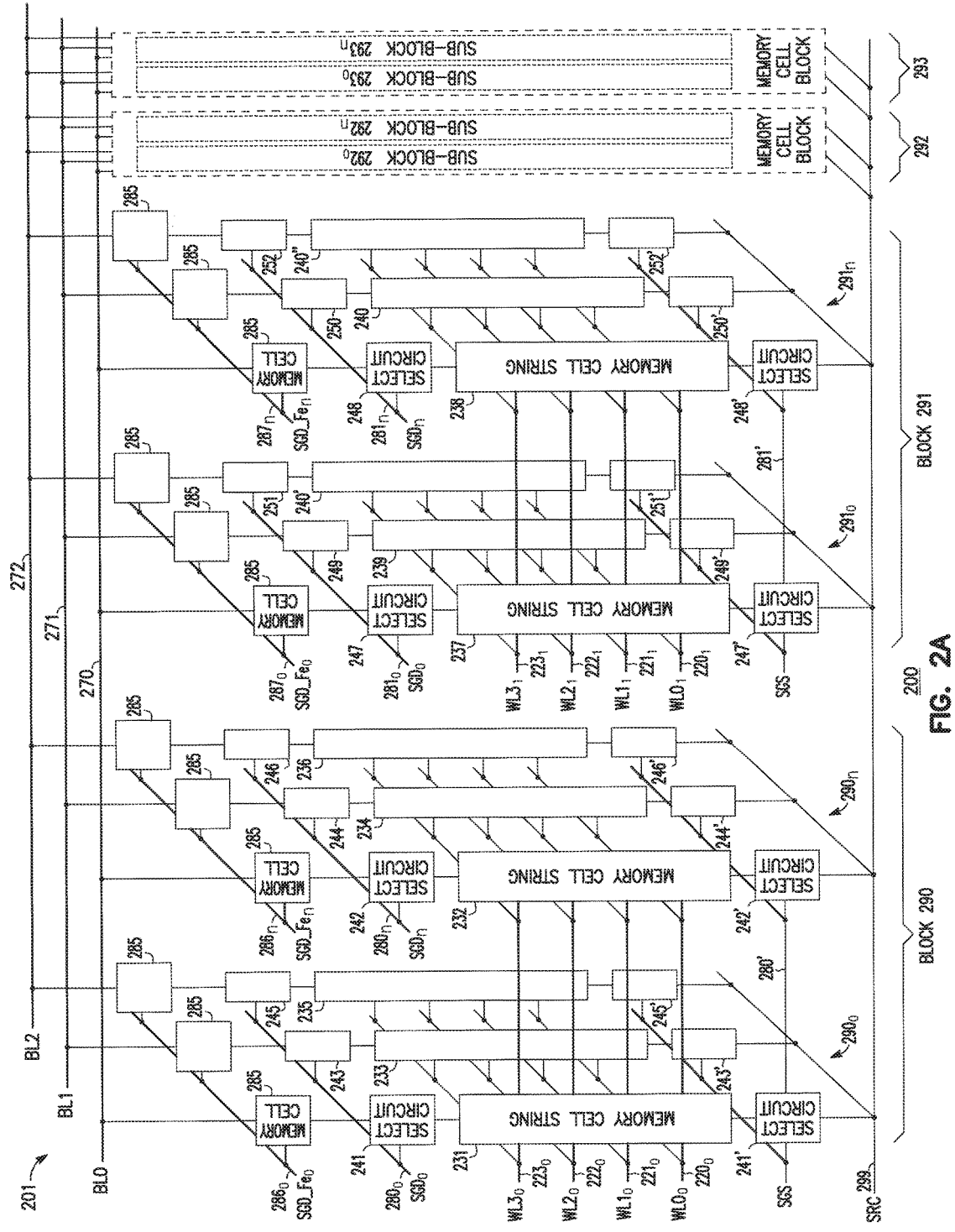
FIG. 2A shows a block diagram of a portion of a memory device including a memory array having memory cells, memory cell strings, and select circuits, according to some embodiments described herein.

FIG. 2A shows a block diagram of a portion of a memory device 200 including a memory array 201 having memory cells 285, memory cell strings 231 through 240, 240', and 240", select circuits 241 through 252 and 241' through 252', according to some embodiments described herein. Memory device 200 can correspond to memory device 100 of FIG. 1. For example, memory array 201 can form part of memory array 101 of FIG. 1.

As shown in FIG. 2A, memory device 200 can include blocks (memory cell blocks) 290, 291, 292, and 293. Four blocks are shown as an example. Memory device 200 can include many blocks (e.g., up to thousands or more blocks). Each of blocks 290, 291, 292, and 293 can have sub-blocks. For example, block 290 has sub-block $290_0$ and $290_n$, block 291 has sub-block $291_0$ and $291_n$, block 292 has sub-block $292_0$ and $292_n$, and block 293 has sub-block $293_0$ and $293_n$. Two sub-blocks (e.g., index n=1) are shown in each of blocks 290, 291, 292, and 293 as an example. Each of blocks 290, 291, 292, and 293 can have more than two sub-blocks (e.g., n>1). For simplicity, FIG. 2A omits detailed circuit elements in blocks 292 and 293. However, blocks 292 and 293 can have circuit elements similar to those of blocks 290 and 291.

As shown in FIG. 2A, block 290 can include memory cell strings 231 through 236, select circuits 241 through 246 and 241' through 246', and a portion of memory cells 285. Block 291 can include memory cell strings 237 through 240, 240', and 240", select circuits 247 through 252 and 247' through 252', and another portion of memory cells 285. Each of memory cell strings 231 through 240, 240', and 240" has memory cells (e.g., memory cells 201, 211, 212, and 213 shown in FIG. 2B) that are different from memory cells 285 and are arranged in a string (e.g., memory cells coupled in series among each other) to store information. During an operation (e.g., write or read) of memory device 200, memory cell strings 231 through 240, 240', and 240" and their associated select circuits can be individually selected to access the memory cells (e.g., memory cells 201, 211, 212, and 213 shown in FIG. 2B) in the selected memory cell string in order to store information in or read information from the selected memory cell string. During an erase operation, all of the memory cell strings in a particular block can be selected (e.g., concurrently selected) to erase information from them.

Each of the memory cell strings 231 through 240, 240', and 240", can be associated with (e.g., coupled to) two select circuits, and one of memory cells 285. For example, memory cell string 231 is associated with select circuit (e.g., top select circuit) 241, select circuit (e.g., bottom select circuit) 241', and a memory cell 285 (above select circuit 241). FIG. 2A shows an example of six memory cell strings and their associated circuits (e.g., top and bottom select circuits) in each of blocks 290 and 291. The number of memory cell strings and their associated select circuits in each of blocks 290 and 291 can vary.

As shown in FIG. 2A, memory device 200 can include lines 270, 271, and 272 that carry signals BL0, BL1, and BL2, respectively. Each of lines 270, 271, and 272 can be structured as a conductive line and can form part of a respective data line (e.g., bit line) of memory device 200. The memory cell strings of blocks 290, 291, 292, and 293 can share lines 270, 271, and 272. For example, memory cell strings 231, 232, 237, and 238 can share line 270. Memory cell strings 233, 234, 239, and 240 can share line 271. Memory cell strings 235, 236, 240', and 240" can share line 272. FIG. 2A shows three lines (e.g., data lines) 270, 271, and 272 as an example. The number of data lines of memory device 200 can vary.

Memory device 200 can include a line 299 that can carry a signal SRC (e.g., source line signal). Line 299 can be structured as a conductive line and can form part of a source (e.g., a source line) of memory device 200. Blocks 290, 291, 292, and 293 can share line 299.

Memory device 200 can include separate control lines in blocks 290, 291, 292, and 293. For example, memory device 200 can include control lines $220_0$, $221_0$, $222_0$, and $223_0$ in block 290 that can carry corresponding signals (e.g., word line signals) $WL0_0$, $WL1_0$, $WL2_0$, and $WL3_0$; and control lines $220_1$, $221_1$, $222_1$, and $223_1$ in block 291 that can carry corresponding signals (e.g., word line signals) $WL0_1$, $WL1_1$, $WL2_1$, and $WL3_1$. FIG. 2A shows four control lines ($220_0$ through $223_0$ or $220_1$ through $223_1$) in each of blocks 290 and 291 as an example. The number of control lines of memory device 200 can vary.

Control lines $220_0$ through $223_0$ and $220_1$ through $223_1$ can form part of respective access lines (e.g., word lines) of memory device 200 to access memory cells of memory cell strings 231 through 240, 240', and 240" in a respective block. For example, during a read or write operation to store information in or read information from a memory cell (or memory cells) in block 290, control lines $220_0$, $221_0$, $222_0$, and $223_0$ of block 290 can be activated (e.g., provided with positive voltages) to access a selected memory cell (or selected memory cells) in block 290. In the example here, control lines $220_1$, $221_1$, $222_1$, and $223_1$ of block 291 can be deactivated (e.g., provided with zero volts (e.g., ground)) when control lines $220_0$, $221_0$, $222_0$, and $223_0$ of 290 are activated. In memory device 200, blocks 290, 291, 292, and 293 (which share the same data lines (e.g., lines 270, 271, and 272)) can be accessed (e.g., accessed during a read or write operation) one block at a time.

As shown in FIG. 2A, memory device 200 can include select lines (e.g., drain select lines) $280_0$ and $280_n$ in block 290 and select lines (e.g., drain select lines) $281_0$ and $281_n$ in block 291. Each of select lines $280_0$, $280_n$, $281_0$, and $281_n$ can carry a different signal ($SGD_0$ or $SGD_n$). FIG. 2A shows blocks 290 and 291 as having signals with the same names (e.g., $SGD_0$ or $SGD_n$) for simplicity. However, signals $SGD_0$ and $SGD_n$ of one block are different from signals $SGD_0$ and $SGD_n$ of another block.

In block 290, select circuits 241, 243, and 245 can share select line $280_0$, and select circuits 242, 244, and 246 can share select line $280_n$. In block 291, select circuits 247, 249, and 251 can share select line $281_0$, and select circuits 248, 250, and 252 can share select line $281_n$. Each of select circuits 241 through 252 in blocks 290 and 291 can include a select gate (e.g., a transistor, shown in FIG. 2B) that can be controlled (e.g., turned on or turned off) by a respective select line (e.g., select line $280_0$, $280_n$, $281_1$, or $281_n$).

Memory device 200 can include a select line (e.g., source select line) 280' in block 290, and a select line (e.g., source select line) 281' in block 291. Each of select lines 280' and 281' can carry a signal SGS. Signal SGS of one block (e.g., block 290) can be different from signal SGS of another block (e.g., block 291). FIG. 2A shows lines 280' and 281' are separated from each other as an example. However, lines 280' and 281' can be coupled to each other, such that blocks 290 and 291 can share signal SGS.

In block 290, select circuits 241', 242', 243', 244', 245', and 246' can share select line 280'. In block 291, select circuits 247', 248', 249', 250', 251', and 252' can share select line 281'. Each of select circuits 241' through 252' in blocks 290 and 291 can include a select gate (e.g., a transistor, shown in FIG. 2B) that can be controlled (e.g., turned on or turned off) by a respective select line (e.g., select line 280' or 281').

During an operation of memory device 200, one or both select circuits associated with a selected memory cell string can be activated (e.g., by turning on the transistors in the select circuits), depending on which operation memory device 200 performs on the selected memory cell string. During a write operation of memory device 200, memory device 200 can concurrently select memory cells of memory cell strings of sub-blocks of a selected block in order to store information in (e.g., during a write operation) in the selected memory cells. In a write operation of memory device 200, a selected block is the block being selected to store information in at least one memory cell of at least one memory cell string of that block. In a write operation of memory device 200, a deselected block is the block not being selected to store information in any memory cell of memory cell strings of that block.

During a read operation of memory device 200, memory device 200 can select a block as a selected block to read information from memory cells of the selected block. During an erase operation, memory device 200 can select a block as a selected block to erase information from memory cells in a portion (e.g., a sub-block or multiple sub-blocks) of the selected block or memory cells from the entire selected block.

Activating a particular select circuit among select circuits 241 through 252 during an operation of memory device 200 can include providing (e.g., applying) voltages having certain values to signals $SGD_0$ and $SGD_n$ associated with that particular select circuit. Activating a particular select circuit among select circuits 241' through 252' can include providing (e.g., applying) voltages having certain values to signal SGS associated with that particular select circuit.

As shown in FIG. 2A, memory device 200 can include lines (e.g., conductive lines) $286_0$ and $286_n$ in block 290 and lines (e.g., conductive lines) $287_0$ and $287_n$ in block 291. Each of lines $286_0$, $286_n$, $287_0$, and $287_n$ can carry a different signal (SGD_Fe$_0$ or SGD_Fe$_n$). FIG. 2A shows blocks 290 and 291 as having signals with the same names (e.g., SGD_Fe$_0$ or SGD_Fe$_n$) for simplicity. However, signals SGD_Fe$_0$ and SGD_Fe$_n$ of one block (e.g., block 290) are different from signals SGD_Fe$_0$ and SGD_Fe$_n$ of another block (e.g., block 291). Each of memory cells 285 can be coupled in series with respective select circuits (among select circuits 241 through 252 and 241' through 252') and a respective memory cell string (among memory cell strings 231 through 240, 240', and 240") between a respective data line (one of lines 270, 271, and 272) and line (e.g., source) 299.

As shown in FIG. 2A, in block 290, memory cells 285 coupled to select circuits 241, 243, and 245 can share line $286_0$, and memory cells 285 coupled to select circuits 242, 244, and 246 can share select line $286_n$. In block 291, memory cells 285 coupled to select circuits 247, 249, and 251 can share line $287_0$, and memory cells 285 coupled to select circuits 248, 250, and 252 can share select line $287_n$.

Memory cells 285 can correspond to memory cells 185 of FIG. 1. For example, memory cells 185 can have a non-volatile memory cell type that is different from a non-volatile memory cell type of the memory cells of memory cell strings 231 through 240, 240', and 240".

Memory cells 285 in each of blocks 290 and 291 can be used to serve different functions depending on whether or not the block is a selected block and depending on which operation memory device 200 operates. For example, memory device 200 can use memory cells 285 of a deselected block to temporarily store information that is to be stored in a selected block during a write operation. In another example, memory device 200 can use memory cells 285 of a selected block as switches (e.g., transistors) and selectively turn them on or off to control the programming (e.g., allow programming or not allow programming) of selected memory cells of the selected block during a write operation. Thus, in a write operation, memory cells 285 of a particular block (among blocks 290, 291, 292, and 293) can operate as memory cells to store (e.g., temporarily store) information if that particular block is a selected block, or operate as switches if that particular block is a deselected block. During read and erase operations, memory cells 285 of blocks 290, 291, 292, and 293 can operate in ways (e.g., operate as switches) similar to select circuits 241 through 252.

Figure 2B:
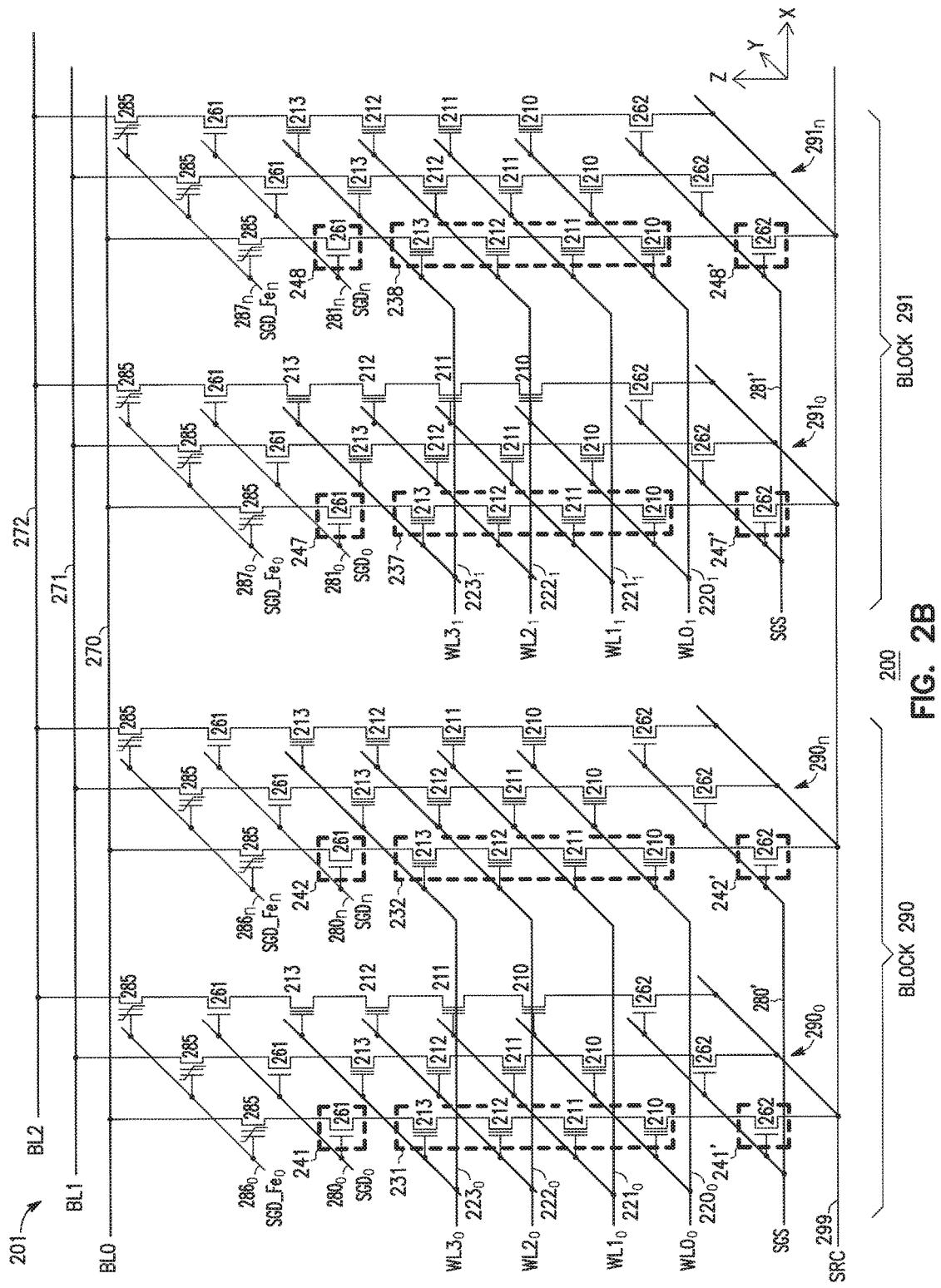
FIG. 2B shows a schematic diagram of a portion of the memory device of FIG. 2A, according to some embodiments described herein.

FIG. 2B shows a schematic diagram of a portion of memory device 200 of FIG. 2A, according to some embodiments described herein. For simplicity, FIG. 2B shows lines 270, 271, and 272, and circuit components of only blocks 290 and 291 (omitting blocks 292 and 293). Also for simplicity, only four of the memory cell strings (memory cell strings 231, 232, 237 and 238) are labeled, only four of the top select circuits (241, 242, 247, and 248) are labeled, and only four of the bottom select circuits (241', 242', 247', and 248') are labeled.

As shown in FIG. 2B, memory device 200 can include memory cells 210, 211, 212, and 213, that can be physically arranged in three dimensions (3-D), such as x, y, and z dimensions of memory device 200. Memory cells 210, 211, 212, and 213 can correspond to memory cells 110 of FIG. 1. Thus, memory cells 210, 211, 212, and 213 can include non-volatile memory cells (e.g., floating gate memory cells, charge trap memory cells, or other types of non-volatile memory cells). Each of the memory cell strings (e.g., strings 231, 232, 237 and 238) can include one of memory cells 210, one of memory cells 211, one of memory cells 212, and one of memory cells 213 coupled in series among each other. FIG. 2B shows an example where memory device 200 has four levels (e.g., four tiers) of respective memory cells 210, 211, 212, and 213 and four memory cells in each of the memory cell strings. The number of levels (e.g., tiers) of memory cells, and the number of memory cells in each memory cell string, can vary.

As shown in FIG. 2B, memory device 200 can include select gates (e.g., drain select gates) 261 and select gates (e.g., source select gates) 262 associated with select lines $280_0$, $280_n$, $281_0$, $281_n$, 280', and 281'. In memory device 200, a select line (e.g., select line $280_0$, $280_n$, $281_0$, $281_n$, 280', or 281') can include a conductive material to carry a signal (e.g., signal SGD$_0$, SGD-N, or SGS) but a select line does not operate like a switch (e.g., a transistor). A select gate (e.g., select gate 261 or 262) can receive a signal from a respective select line and can operate like a switch (e.g., a transistor, such as a field-effect transistor (FET)).

As shown in FIG. 2B, each of memory cells 285 can be coupled in series with memory cells 210, 211, 212, and 213 of a respective memory cell string (among memory cell strings 231, 232, 237 and 238), such that each of memory cells 285 can be between one of lines 270, 271, and 272 and a respective memory cell string. Each of memory cells 285 can include a memory cell transistor, which can include a ferroelectric memory cell transistor (as symbolically shown in FIG. 2B). FIG. 2B shows an example where each of memory cells 285 can include a ferroelectric memory cell type. However, each of memory cells 285 can include another non-volatile memory cell type similar to the non-volatile memory cell type of memory cell 185 of FIG. 1 (e.g., phase change memory cell type, resistive memory cell type, conduction bridge memory cell type, STT-MRAM cell type, or other types of non-volatile memory cells).

Each of memory cells 285 can be configured (e.g., structured) such that storing an amount (e.g., a number of bits) of information (e.g., data) in them can take less time than storing that same amount of information in each of memory cells 210, 211, 212, and 213. Each of memory cells 285 can be configured to store fewer bits of information than each of memory cells 210, 211, 212, and 213. As an example, each of memory cells 285 can be configured to store at most one bit of information, and each of memory cells 210, 211, 212, and 213 can be configured to store more than one bit of information. In another example, each of memory cells 285 can be configured to store more than one bit of information. As described in more detail below, memory device 200 can temporarily store (e.g., store for a short duration (e.g., a second or a fraction of a second)) information in memory cells 285 before the information is stored (e.g., stored for a longer duration (e.g., days, months, or years)) in memory cells 210, 211, 212, and 213. In comparison with some conventional memory devices, structuring and operating memory device 200 as described herein may lead to a lower energy to store a bit of information in memory cells 210, 211, 212, and 213, and higher program throughput in memory device 200.

FIG. 3A shows an example of threshold voltage value ranges 310 and 311 of threshold voltages $Vt_0$ and $Vt_1$, respectively, of memory cells 285 of memory device 200 of FIG. 2B, according to some embodiments described herein. As described above, each of memory cells 285 can be configured to store at most one bit (a single bit) of information. The bit can have a value of binary 0 or binary 1. In FIG. 3A, level 0 (L0) and level 1 (L1) correspond to two values (binary 0 and binary 1) of a bit that can be stored in each of memory cell 285. Level L0 can be called an erase level (e.g., erase state). Each of levels L0 and L1 has a threshold voltage value range for a large number of memory cells (among memory cells 285). Each of threshold voltages $Vt_0$ and $Vt_1$ has a value (analog voltage value in volt unit) within a corresponding threshold voltage value range. For example, threshold voltage $Vt_0$ can be any value (e.g., a negative voltage value in volt unit) within threshold voltage value range 310, and threshold voltage $Vt_1$ can be any value (e.g., a positive voltage value) within threshold voltage value range 311. The value of threshold voltage $Vt_1$ is greater than the value of threshold voltage $Vt_0$. The value of each of threshold voltage $Vt_0$ and $Vt_1$ can be used to represent a value (binary value) of one bit of information.

FIG. 3B is an example chart (e.g., a table) showing threshold voltages (e.g., states) $Vt_0$ and $Vt_1$ and corresponding values (binary values) of a bit B, according to some embodiments described herein. For example, the values (e.g., in volt unit) of threshold voltage $Vt_0$ (e.g., $Vt_0=-1V$) and threshold voltage $Vt_1$ (e.g., $Vt_1=+1V$) can be used to represent values 1 and 0 (binary value), respectively, of bit B. Memory device 200 (FIG. 2B) can cause the threshold voltage of a particular memory cell among memory cells 285 to be the value of either threshold voltage $Vt_0$ or threshold voltage $Vt_1$ depending on the value of the bit (e.g., bit B) to be stored in that particular memory cell. For example, based on the chart in FIG. 3A, memory device 200 can cause the threshold voltage (e.g., a state) of a memory cell among memory cells 285 to be the value (e.g., a negative voltage value) of threshold voltages $Vt_0$ if information to be stored in the memory cell is binary 1. In another example, based on the chart in FIG. 3A, memory device 200 can cause the threshold voltage (e.g., a state) of a memory cell among memory cells 285 to be the value (e.g., a positive voltage value) of threshold voltages $Vt_1$ if information to be stored in the selected memory cell is binary 0.

In a write operation, memory device 200 can selectively apply different voltages (having different values) to lines $286_0$, $286_n$, $287_0$, and $287_n$ and lines 270, 271, and 272 to cause the threshold voltages of a particular memory cell (or memory cells) among memory cells 285 to change or to remain unchanged. For example, in FIG. 2B, to cause the threshold voltage of memory cell 285 coupled to select circuit 247 to have threshold voltage $Vt_1$ (e.g., to change from $Vt_0$ (e.g., $-1V$) to $Vt_1$ (e.g., $+1V$)), memory device 200 can apply a positive voltage (e.g., 6V) to line $287_0$ and a voltage of 0V (e.g., ground potential) to line 270. In this example, memory device 200 can apply a positive voltage (e.g., 6V) to lines 271 and 272 while the positive voltage (e.g., 6V) is applied to line $287_0$ if the threshold voltages of the memory cells 285 sharing line $287_0$ with memory cell 285 coupled to select circuit 247 are to remain unchanged at their current threshold voltages (e.g., at $Vt_0=-1V$). In another example, in FIG. 2B, to cause the threshold voltage of memory cell 285 coupled to select circuit 247 to have threshold voltage $Vt_0$ (e.g., to change from $Vt_1$ (e.g., $+1V$) to $Vt_0$ (e.g., $-1V$)), memory device 200 can apply a positive voltage (e.g., 6V) to line 270 and a voltage of 0V (e.g., ground potential) to line $287_0$.

Thus, based on the chart in FIG. 3B, to use a particular memory cell among memory cells 285 to temporarily store information, memory device 200 (FIG. 2B) can cause the threshold voltage of that particular memory cell to be at different values (e.g., $Vt_1=-1V$ or $+1V$) to represent the value of information (e.g., a bit of information) stored therein. To use a particular memory cell among memory cells 285 as a switch and to turn it on, memory device 200 (FIG. 2B) can apply a bias voltage (e.g., Vg) to the line (e.g., one of lines $286_0$, $286_n$, $287_0$, and $287_n$) associated with that particular memory cell, such that the value of the bias voltage is greater than the value of the threshold voltage of that particular memory cell (e.g., Vg=0V and Vt=$-1V$). To use a particular memory cell among memory cells 285 as a switch and to turn it off, memory device 200 (FIG. 2B) can apply a bias voltage (e.g., Vg) to the line (e.g., one of lines $286_0$, $286_n$, $287_0$, and $287_n$) associated with that particular memory cell, such that the value of the bias voltage is less than the value of the threshold voltage of that particular memory cell (e.g., Vg=0V and Vt=$+1V$).

FIG. 3C shows an example of threshold voltage value ranges 320 through 327 of corresponding threshold voltages $Vt_0$ through $Vt_7$ of memory cells 210, 211, 212, and 213 of memory device 200 of FIG. 2B, according to some embodiments described herein. As described above, each of memory cells 210, 211, 212, and 213 is configured to store more than one bit of information. FIG. 3C shows an example of threshold voltage value ranges 320 through 327 for memory cells 285 when each of memory cells 210, 211, 212, and 213 can be configured to store three bits (e.g., bits B0, B1, and B2) of information. FIG. 3C shows eight levels (level 0 (L0) through level 7 (L7)) corresponding to eight different combinations of three bits. Level L0 can be called an erase level (e.g., erase state). Each of levels L0 through L7 has a threshold voltage value range for a large number of memory cells (among memory cells 210, 211, 212, and 213).

Each of threshold voltages $Vt_0$ through $Vt_7$ has a value (analog voltage value) within a corresponding threshold voltage value range. For example, threshold voltage $Vt_1$ can be any value (a positive voltage value in volt unit) within threshold voltage value range 321, and threshold voltage $Vt_7$ can be any value (a positive voltage value in volt unit) within threshold voltage value range 327.

As shown in FIG. 3C, the values of threshold voltages $Vt_0$ through $Vt_7$ can go from a value within a lowest value range (threshold voltage value range 320 corresponding to level L0) to a value within a highest threshold voltage value range (threshold voltage value range 327 corresponding to level L7). Thus, the value of threshold voltage $Vt_7$ is greatest among the values of threshold voltages $Vt_0$ through $Vt_7$. The value of each of threshold voltage $Vt_0$ through $Vt_7$ can be used to represent a value (binary value) of a combination of three bits of information.

FIG. 3D is an example chart (e.g., a table) showing threshold voltages $Vt_0$ through $Vt_7$ (eight different threshold voltages) and corresponding values (eight combinations of binary values) of three bits B0, B1, and B2 according to some embodiments described herein. For example, the values (e.g., in volt units) of threshold voltages $Vt_0$ through $Vt_7$ can be used to represent values (binary values) 000, 001, 010, 011, 100, 101, 110, and 111, respectively, of bits B0, B1, and B2. FIG. 3D shows the values of threshold voltages $Vt_0$ through $Vt_7$ being assigned to (e.g., mapped to) values (000 through 111) of bits B0, B1, and B2 in a sequential order (sequentially from a lower binary value to a higher binary value), as an example. However, the values of threshold voltages $Vt_0$ through $Vt_7$ can be assigned to values of bits B0, B1, and B2 in any order (e.g., non-sequential order). Based on the chart in FIG. 3D, during a write operation, the target value (analog value) for the threshold voltage of a selected memory cell (one of memory cells 210, 211, 212, and 213 in FIG. 2B) is based on the value (binary value) of bits B0, B1, and B3 to be stored in that selected memory cell. For example, if three bits (B0, B1, and B2) having a value binary value of 100 are to be stored in a selected memory cell (one of memory cell 210, 211, 212, and 213), then memory device 200 can cause (e.g., program) the threshold voltage of that selected memory cell to be the value of threshold voltage $Vt_4$ ("100"=$Vt_4$ based on the chart in FIG. 3D).

Figure 4A:
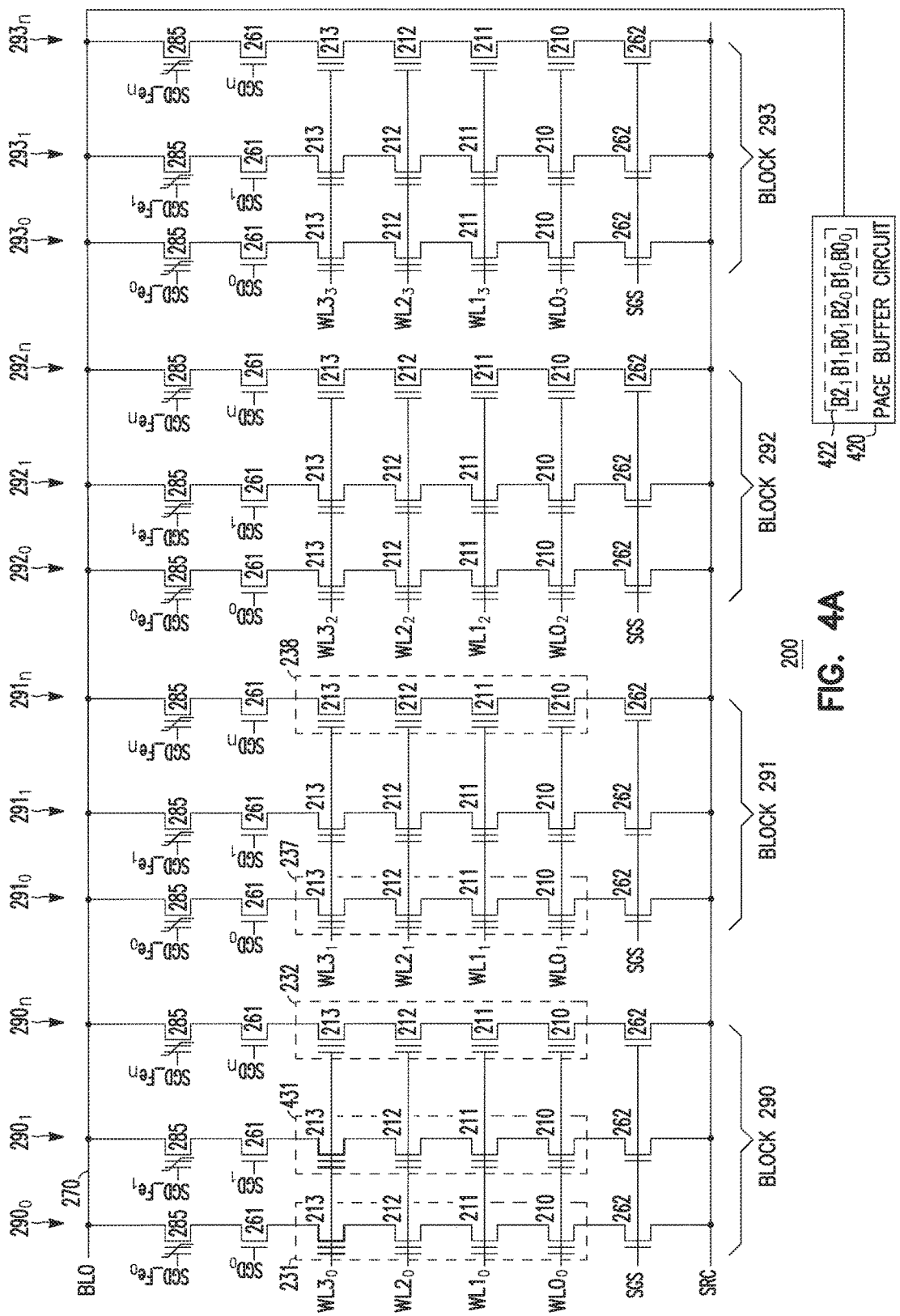
FIG. 4A shows a portion of the memory device of FIG. 2B including information to be stored in a selected block during an example write operation of the memory device, according to some embodiments described herein.

FIG. 4A shows a portion of memory device 200 of FIG. 2B including information 422 to be stored in memory cells 210, 211, 212, and 213 of one of blocks 290, 291, 292, and 293 during an example write operation of memory device 200, according to some embodiments described herein. The portion of memory device 200 in FIG. 4A includes sub-blocks $290_0$, $290_1$, and $290_n$ of block 290; sub-blocks $291_0$, $291_1$, and $291_n$ of block 291; sub-blocks $292_0$, $292_1$, and $292_n$ of block 292; and sub-block $293_0$, $293_1$, and $293_n$. Memory cell strings 231, 232, 237 and 238 are the same as those shown in FIG. 2B. For simplicity, except for memory cell string 431 in FIG. 4A, other memory cell strings shown in FIG. 4A are not labeled.

As shown in FIG. 4A, information 422 can include bits (six bits) $B0_0$, $B1_0$, $B2_0$, $B0_1$, $B1_1$, and $B2_1$ that can be received at (e.g., loaded in) a page buffer circuit 420 of memory device 200. Bits $B0_0$, $B1_0$, $B2_0$, $B0_1$, $B1_1$, and $B2_1$ can be included in different pages of information 422. A page of information can include numerous bits (e.g., thousands of bits). Memory device 200 can store information 422 in memory cells 210, 211, 212, and 213 one page at time or multiple pages at a time.

Page buffer circuit 420 in FIG. 4A of memory device 200 can be part of sense and buffer circuitry that can be similar to sense and buffer circuitry 120 of FIG. 1. Information 422 can be provided to memory device 200 through I/O lines (e.g., a data bus) of memory device 200 from another device (e.g., a memory controller or a processor) coupled to memory device 200. Such I/O lines of memory device 200 can be similar to lines 105 of FIG. 1. FIG. 4A shows information 422 including six bits as an example. Information 422 can include a different number (e.g., thousands) of bits.

In the example write operation associated with FIG. 4A (and FIG. 4B, FIG. 4C, and FIG. 4D described below), information 422 (e.g., bits $B0_0$, $B1_0$, $B2_0$, $B0_1$, $B1_1$, and $B2_1$) is assumed to be stored in selected memory cells among memory cells 210, 211, 212, and 213 of block 290. Thus, in this example, block 290 is a selected block, and blocks 291, 292, and 293 are deselected (unselected) blocks. As described in more detail below with reference to FIG. 4B, FIG. 4C, and FIG. 4D, after information 422 are loaded in page buffer circuit 420 (FIG. 4A), memory device 200 temporarily stores information 422 in memory cells 285 of blocks 291, 292, and 293 (deselected blocks). Then, memory device 200 stores information (e.g., bits) in memory cells 210, 211, 212, and 213 of block 290 (selected block), such that the value of the information stored in block 290 are based on (e.g., equal to) the value of information 422 (the values of bits $B0_0$, $B1_0$, $B2_0$, $B0_1$, $B1_1$, and $B2_1$) stored in memory cells 285 of blocks 291, 292, and 293. Thus, a write operation in memory device 200 can include an initial write stage that stores information (e.g., information 422) in memory cells 285 of deselected blocks and a subsequent write stage to store information (e.g., information 422) in memory cells 210, 211, 212, and 213 of the selected block.

Figure 4B:
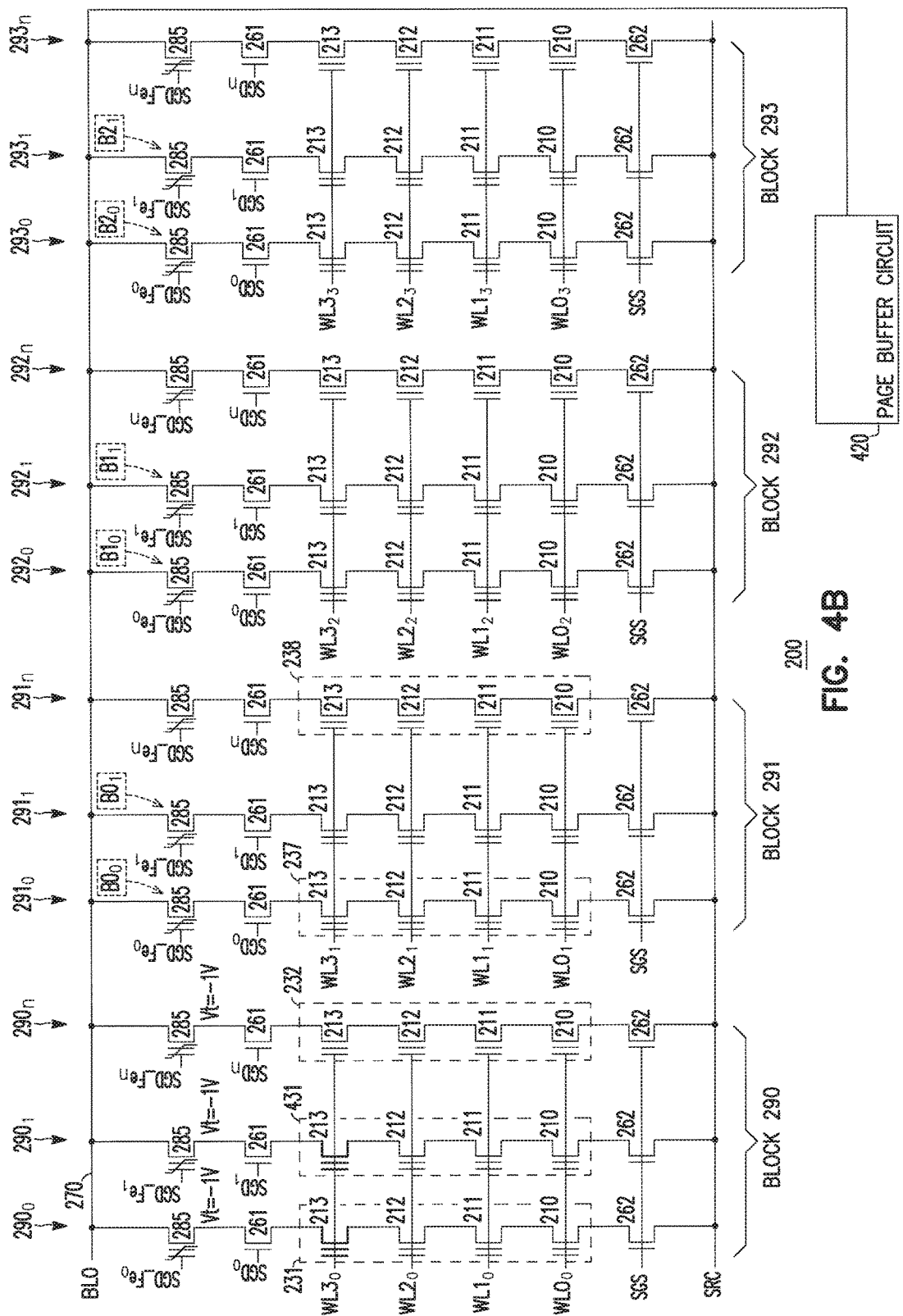
FIG. 4B shows a portion of the memory device of FIG. 4A including information temporarily stored in deselected blocks during the example write operation of the memory device, according to some embodiments described herein.

FIG. 4B shows memory device 200 of FIG. 4A after bits $B0_0$, $B1_0$, $B2_0$, $B0_1$, $B1_1$, and $B2_1$ of information 422 are stored (e.g., temporarily stored) in respective memory cells 285 of blocks 291, 292, and 293 (deselected blocks). As shown in FIG. 4B, bits $B0_0$, $B0_1$, $B1_0$, $B1_1$, $B2_0$, and $B2_1$ can be stored in memory cells 285 of sub-blocks $291_0$, $291_1$, $292_0$, $292_1$, $293_0$, and $293_1$, respectively. In the example of FIG. 4B, only one bit of information 422 is stored in a respective memory cell among memory cells 285. Since the portion of sub-blocks $291_0$, $291_1$, $292_0$, $292_1$, $293_0$, and $293_1$ (FIG. 4B) share the same data line (e.g., line 270), memory device 200 may store bits $B0_0$, $B0_1$, $B10$, $B1_1$, $B2_0$, and $B2_1$ in memory cells 285 of sub-blocks $291_0$, $291_1$, $292_0$, $292_1$, $293_0$, and $293_1$ in a sequential fashion (e.g., store one bit at a time). For example, memory device 200 may sequentially activate (activate one at a time) signals $SGD\_FE_0$, $SGD\_Fe_1$ (of block 291), $SGD\_FE_0$, $SGD\_Fe_1$ (of block 292), $SGD\_FE_0$, and $SGD\_Fe_1$ (of block 293) to store bits $B0_0$, $B0_1$, $B1_0$, $B1_1$, $B2_0$, and $B2_1$ one at a time in respective memory cells 285. FIG. 4B shows an example order where bits $B0_0$, $B0_1$, $B10$, $B1_1$, $B2_0$, and $B2_1$ are stored in particular memory cells 285 of particular sub-blocks among blocks 291, 292, and 293. However, bits $B0_0$, $B0_1$, $B10$, $B1_1$, $B2_0$, and $B2_1$ can be stored in memory cells 285 of sub-blocks of blocks 291, 292, and 293 in a different order.

In the example of FIG. 4B, memory device 200 may not use memory cells 285 of block 290 (selected block) to store information (e.g., information 422). However, memory device 200 can use memory cells 285 of block 290 as switches to control the threshold voltage (e.g., state) of each of memory cells 285 of block 290 when memory device 200 stores information in selected memory cells 210, 211, 212, and 213 of block 290. For example, memory device 200 can cause threshold voltage Vt of memory cell 285 coupled to memory cell string 231 to be at one value (e.g., Vt=−1V) if the selected memory cell (one of memory cells 210, 211, 212, and 213) in memory cell string 231 has not reached its target threshold voltage (e.g., one of $Vt_0$ through $Vt_7$ in FIG. 3C and FIG. 3D). In another example, memory device 200 can cause threshold voltage Vt of memory cell 285 coupled to memory cell string 231 to be at another value (e.g., Vt=+1V) if the selected memory cell in memory cell string 231 has reached its target threshold voltage (e.g., one of $Vt_0$ through $Vt_7$ in FIG. 3D).

Thus, in a write operation to store information in a selected block, causing a particular memory cell among memory cells 285 of the selected block to have a particular value (e.g., Vt=−1V or Vt=+1V) may either allow programming or prevent programming of a selected memory cell coupled to that particular memory cell. For example, as described above, in a write operation to store information in a selected block, causing a particular memory cell among memory cells 285 of the selected block to have a value of Vt=−1V may allow programming of a selected memory cell coupled to that particular memory cell. Causing a particular memory cell among memory cells 285 of the selected block to have a value of Vt=−1V may prevent programming of a selected memory cell coupled to that particular memory cell. Before storing information in selected memory cells among memory cells 210, 211, 212, and 213, memory device 200 can operate (e.g., perform a read operation before the write operation or a verify stage within the write operation) to determine whether selected memory cells have reached their respective threshold voltages. FIG. 4B shows Vt=−1 in memory cells 285 of block 290 to illustrate an example where selected memory cells of block 290 have not reached their respective threshold voltage values.

FIG. 4C shows block 290 after information (bits $B0'_0$, $B1'_0$, and $B2'_0$) is stored in memory cell 213 of memory cell string 231 of sub-block $290_0$. In the following description with reference to FIG. 4C and FIG. 4D, it is assumed that memory cells 213 of memory cell strings 231 and 431 are selected memory cells to store information. The value of the combination of bits $B0'_0$, $B1'_0$, and $B2'_0$ (FIG. 4C) stored in memory cell 213 of memory cell string 231 is based on (e.g., is the same as) the value of the combination of bits $B0_0$, $B1_0$, $B2_0$ stored in memory cells 285 of blocks 291, 292, and 293 (deselected blocks) of FIG. 4B. For example, if the value of the combination of bits $B0_0$, $B1_0$, $B2_0$ stored (e.g., temporarily stored) in blocks 291, 292, and 293 is "010" (binary value), then the value of the combination of bits $B0'_0$, $B1'_0$, $B2'_0$ stored in memory cell 213 of memory cell string 231 is also "010".

As shown in FIG. 4C, after memory device 200 stores bits $B0'_0$, $B0'_1$, and $B0'_2$ in memory cell 213 of memory cell string 231 (which is after memory cell 213 of memory cell string 231 has reached its target threshold voltage), memory device 200 can cause the value of threshold voltage Vt of memory cell 285 (coupled to memory cell string 231) to change from −1V to +1V. This turns off memory cell 285 (coupled to memory cell string 231) and causes the pillar (shown in FIG. 8) associated with memory cell string 231 to have a particular voltage (e.g., a boosted voltage of 10V). The boosted voltage can prevent memory cell 213 of memory cell string 231 (which has reached its target threshold voltage) from being further programmed when memory device 200 stores information in (e.g., programs) another selected memory cell (e.g., memory cell 213 of memory cell string 431, or other selected memory cells) of block 290. FIG. 4C shows Vt=−1V in memory cell 285 coupled to memory cell string 431 to indicate that memory cell 213 of memory cell string 431 has not reached its target threshold voltage when memory cell 213 of memory cell string 231 has reached its target threshold voltage.

FIG. 4D shows block 290 after information (bits $B0'_1$, $B1'_1$, $B2'_1$) is stored in memory cell 213 of memory cell string 431 of sub-block $290_1$. The value of the combination of bits $B0'_1$, $B1'_1$, and $B2'_1$ stored in memory cell 213 of memory cell string 431 is based on (e.g., is the same as) the value of the combination of bits $B0_1$, $B1_1$, $B2_1$ stored in memory cells 285 of blocks 291, 292, and 293 (deselected blocks) of FIG. 4B. For example, if the value of bits $B0_1$, $B1_1$, $B2_1$ is "110" (binary value), then the value of bits $B0'_1$, $B1'_1$, $B2'_1$ is also "110".

Similar to storing information (e.g., bits $B0'_0$, $B1'_0$, $B2'_0$) in memory cell 213 of memory cell string 231 (FIG. 4C), after memory device 200 (FIG. 4D) stores bits $B0'_1$, $B1'_1$, $B2'_1$ in memory cell 213 of memory cell string 431 (which is after memory cell 213 of memory cell string 431 has reached its target threshold voltage), memory device 200 can cause the value of threshold voltage Vt of memory cell 285 (coupled to memory cell string 431) to change from −1V to +1V. This turns off memory cell 285 coupled to memory cell string 431 and prevents memory cell 213 of memory cell string 431 (which has reached its target threshold voltage) from further being programmed.

Thus, as described above with reference to FIG. 4A through FIG. 4D, memory device 200 can use memory cells 285 of blocks 291, 292, and 293 (deselected blocks) to temporarily store information 422 (e.g., bits $B0_0$, $B1_0$, $B2_0$, $B0_1$, $B1_1$, and $B2_1$ in FIG. 4B). Memory device 200 can use memory cells 285 of block 290 (selected block) as switches while storing information (e.g., bits $B0'_0$, $B1'_0$, $B2'_0$, $B0'_1$, $B1'_1$, and $B2'_1$ in FIG. 4C and FIG. 4D) in selected memory cells of block 290. Memory device 200 can control the threshold voltages of memory cells 285 (e.g., to turn them on or off) in order to allow or prevent programming of the selected memory cells of block 290 depending on whether the selected memory cells have reached their respective target threshold voltages.

FIG. 5 is a chart 500 showing example values for some of the signals and threshold voltages of block 290 of memory device 200 of FIG. 4A, FIG. 4B, and FIG. 4C during an example write operation, according to some embodiments described herein. The example write operation associated with chart 500 of FIG. 5 can correspond to the write operation described above with reference to FIG. 4A, FIG. 4B, and FIG. 4C. The following description refers to FIG. 4A through FIG. 5.

In FIG. 5, program loops 1, 2, 3, 4, and 5 are five example program loops (e.g., iterations) performed by memory device 200 during the example write operation to store information in selected memory cells of memory cell strings 231 and 431 (FIG. 4A through FIG. 4D). FIG. 5 shows five program loops as an example. A write operation of memory device 200 can include fewer or more than five program loops, depending on when selected memory cells of a selected block reach their respective threshold voltages. In FIG. 5, it is assumed that the target threshold voltage for memory cell 213 (selected memory cell) of memory cell string 231 is 1V ($Vt_{213\_231}$ target=1V), and the target threshold voltage for memory cell 213 (selected memory cell) of memory cell string 431 is 2V ($Vt_{213\_431}$ target=2V). Target threshold voltages $Vt_{213\_231}$ target and $Vt_{213\_431}$ target can correspond to two of the threshold voltages (e.g., $Vt_1$ and $Vt_2$, respectively) of FIG. 3C.

Memory device 200 can sequentially perform program loops 1, 2, 3, 4, and 5 to store (e.g., program) information in the selected memory cells. Memory device 200 can also perform a verify stage after each program loop (e.g., after each of program loops 1, 2, 3, 4, and 5) of a write operation to determine whether the selected memory cells have reached their respective target threshold voltages. For simplicity, chart 500 of FIG. 5 does not show verify stages (e.g., five verify stages) performed after respective program loops 1, 2, 3, 4, and 5.

In a verify stage, memory device 200 can read information stored in memory cells 285 of blocks 291, 292, and 293 (deselected block) and provide the read information to a page buffer circuit (e.g., page buffer circuit 420 in FIG. 4A) of memory device 200. Then, memory device 200 can read information stored in selected memory cells (e.g., memory cells 213 of memory cell strings 231 and 431) of block 290 (selected block) and compare the information read from block 290 with the information in the page buffer circuit (which is information stored in memory cells 285 of blocks 291, 292, and 293). Based on the comparison, memory device 200 can determine when a selected memory cell in block 290 has reached its target threshold voltage.

During a particular program loop of program loops 1, 2, 3, 4, and 5 in chart 500 of FIG. 5, memory device 200 can cause a change (e.g., an increase) in the value of the threshold voltage of a selected memory cell that has not reached its target threshold voltage in the previous program loop, which is the program loop immediately preceding that particular loop. For example, during a particular program loop among loops 1, 2, 3, 4, and 5, memory device 200 can cause the values of the threshold voltages of both memory cells 213 of memory cell strings 231 and 431 (FIG. 4B) to change (e.g., increase) if both memory cells 213 of memory cell strings 231 and 431 have not reached their respective target threshold voltages in the previous program loop. This means that memory device 200 can concurrently program the selected memory cells (e.g., concurrently cause changes in values of threshold voltages of the selected memory cells) of the memory cell strings (e.g., memory cell strings 231 and 431) coupled to the same data line (e.g., line 270 in FIG. 4B). In another example, during a program loop among loops 1, 2, 3, 4, and 5, memory device 200 may not cause the value of the threshold voltage of a selected memory cell (e.g., memory cell 213 of memory cell string 231 or memory cell string 431 in FIG. 4B) to change if that selected memory cell has reached its target threshold voltage in the previous program loop. In each of program loops 1, 2, 3, 4, and 5 in FIG. 5, memory device 200 can control the values of voltages provided to signals of a selected block (e.g., block 290) in order to cause a change or not to cause a change in the value of the threshold voltage of the selected memory cell.

As shown in FIG. 5, in each of program loops 1, 2, 3, 4, and 5, in FIG. 5, signal BL can be provided with a voltage of 0V (e.g., ground potential), and signals SGD_Fe$_0$ and SGD_Fe$_1$ can be provided with a voltage of 0V. Signals SGD$_0$ and SGD$_1$ can be provided with a voltage of 3V to activate (e.g., turn on) select gates 261 of sub-blocks 290$_0$ and 290$_1$ (FIG. 4C) during each of program loops 1, 2, 3, 4, and 5. Turning on both select gates 261 of sub-blocks 290$_0$ and 290$_1$ during each of program loops 1, 2, 3, 4, and 5 allows a concurrent programming (e.g., concurrently changing the values of the threshold voltages) of memory cells 213 of memory cell strings 231 and 431 during a particular program loop (among program loops 1, 2, 3, 4, and 5). In FIG. 5, signals WL0$_0$, WL1$_0$, and WL2$_0$ can be provided with the same voltage of 10V during each of program loops 1, 2, 3, 4, and 5. Signal WL3$_0$ can be provided with different voltages (e.g., ramped-up voltages of 17V, 18V, 19V, 20V, and 21V) during program loops 1, 2, 3, 4, and 5.

As shown in FIG. 5, threshold voltages Vts of memory cells 285 (controlled by respective signals SGD_Fe$_0$ and SGD_Fe$_1$) coupled to respective memory cell strings 231 and 431 of block 290 (selected block) can be either −1V or +1V (example values). These values (e.g., −1V or +1V) during a particular program loop can depend on whether or not a selected memory cell (among memory cell 210, 211, 212, and 213) has reached its target threshold voltage in a previous program loop.

Before each program loop (e.g., between consecutive program loops) 1, 2, 3, 4, and 5, memory device 200 can cause threshold voltage Vt of memory cell 285 coupled to the selected memory cell (among memory cell 210, 211, 212, and 213) of block 290 either to remain at the same value (e.g., −1V) or to change from one value to a different value (e.g., from −1V to +1V) depending on the condition of whether or not that selected memory cell has reached its target threshold voltage. For example, before performing a particular program loop in FIG. 5, memory device 200 can cause threshold voltage Vt of memory cell 285 coupled to a selected memory cell to remain at the same value (e.g., −1V) if the selected memory cell has not reached its target threshold voltage. In another example, memory device 200 can cause threshold voltage Vt of memory cell 285 coupled to the selected memory cell to change from one value to a different value (e.g., from −1V to +1V) if the selected memory cell has reached its target threshold voltage. Changing the value of the threshold voltage of a particular memory cell among memory cells 285 of block 290 is described above with respect to FIG. 3A and FIG. 3B.

In the example of FIG. 5, memory cells 213 of memory cell string 231 and 431 have not reached their respective target threshold voltages (meaning that Vt$_{213\_231}$ target<1V and V$_{213\_431}$ target<2V during each of program loops 1 and 2). Thus, after program loop 2 and before program loop 3, memory device 200 can cause threshold voltages Vt of memory cells 285 (associated with signals SGD_Fe$_0$ and SGD_Fe$_1$ and coupled to memory cells 213 of memory cell strings 231 and 431 in FIG. 4B) to remain at Vt=−1V for program loop 3. During program loop 3, memory cell 213 of memory cell string 231 has reached its target threshold voltage (e.g., Vt$_{213\_231}$=1V during program loop 3). Thus, after program loop 3 and before program loop 4, memory device 200 can cause threshold voltage Vt of memory cell 285 (associated with signals SGD_Fe$_0$ in FIG. 4B) to change from Vt=−1V to Vt=+1V for program loop 4 and subsequent loop 5. This prevents memory cell 213 of memory cell string 231 (which has reached its target threshold voltage) from being further programmed during program loops 4 and 5.

During program loop 3, memory cell 213 of memory cell string 431 has not reached its target threshold voltage (e.g., Vt$_{213\_431}$<1V during program loop 3). Thus, after program loop 3 and before program loop 4, memory device 200 can cause threshold voltage Vt of memory cell 285 (associated with signals SGD_Fe$_1$ in FIG. 4B) to remain at the same value (e.g., Vt=−1V) for program loop 4. This allows memory device 200 to continue to program memory cell 213 of memory cell string 431 during program loop 4.

During program loop 4, memory cell 213 of memory cell string 431 has reached its target threshold voltage (e.g., Vt$_{213\_431}$=2V during program loop 4). Thus, after program loop 4 and before program loop 5, memory device 200 can cause threshold voltage Vt of memory cell 285 (associated with signals SGD_Fe$_1$ in FIG. 4B) to change from Vt=−1V to Vt=+1V for program loop 5 and subsequent program loop (or loops).

Memory device 200 can keep threshold voltage Vt of memory cell 285 coupled to memory cell 213 of memory cell string 231 unchanged (e.g., keep at Vt=+1V) for subsequent program loop 5 (and other subsequent program loops, not shown) during operations of storing information in selected memory cells of block 290.

FIG. 6 shows example waveforms of signals BL0, WL0$_0$, WL1$_0$, WL2$_0$, and WL3$_0$, SGD$_0$, SGD$_1$, SGD_Fe$_0$, SGD_Fe$_1$, and SGS of block 290 (selected block) of memory device 200 (FIG. 4A through FIG. 4C) during a program loop X and a verify stage X of a write operation, according to some embodiments described herein. Program loop X (performed between times T0 and T1) can be one of program loops 1, 2, 3, 4, 5, and 6 of FIG. 5. Memory device 200 can perform verify stage X (performed between times T2 and T4 after time T1) in FIG. 6 after it performs program loop X to determine whether selected memory cells of a selected block (e.g., block 290 in FIG. 4C and FIG. 4D) have reached their respective target threshold voltages after the selected memory cells are programmed in program loop X. For simplicity, FIG. 6 shows only two memory cells 213 of two respective memory cell strings 231 and 431 are selected to be programmed (using the same voltage provided to signal WL3$_0$) by program loop X between times T0 and T1. However, selected memory cells sharing the same control line (e.g., control line 223$_0$ associated with signal WL3$_0$) can be concurrently programmed by program loop X between times T0 and T1.

The signals shown in FIG. 6 are the same as those shown in FIG. 5. As shown in FIG. 6, the signals can be provided with different voltages (e.g., V0 through V5). Voltage V0 can be 0V (e.g., ground potential, such as Vss). Each of voltages V1 through V5 can have a positive value (e.g., a value greater than the value of voltage V0) with some specific values shown in FIG. 6 as examples.

Between times T0 and T1, signals $SGD_0$ and $SGD_1$ can be provided with voltage V1 (e.g., 3V). This can concurrently activate (e.g., currently turn on) select gates 261 (FIG. 4B and FIG. 4C) coupled to memory cells 213 of memory cell strings 231 and 431 and allow memory device 200 to concurrently program (e.g., concurrently changing the threshold voltages) memory cells 213 of memory cell strings 231 and 431 using the same voltage (e.g., V5) provided to signal $WL3_0$ between times T0 and T1.

As shown in FIG. 6, memory device 200 can perform verify stage X after time T1 (after program loop X is performed). Signals $SGD\_Fe_0$ and $SGD\_Fe_1$ can be provided with voltage V2 (e.g., 3V) between times T2 and T4. Signal $SGD_0$ and $SGD_1$ can be sequentially activated (activated one at a time by using voltage V1) as shown in FIG. 6.

Between times T2 and T3, memory device 200 can determine whether memory cell 213 of memory cell string 231 has reached its target threshold voltage (e.g., whether $Vt_{213\_231}=1V$ in FIG. 5) after it was programmed by program loop X. Between times T2 and T3, signal $WL3_0$ can be provided with voltages $V_{PV1}$, $V_{PV2}$, and $V_{PV3}$ (program verify voltages) having different values to allow memory device 200 to determine whether memory cell 213 of memory cell string 231 has reached its target threshold voltage. The values of voltages $V_{PV1}$, $V_{PV2}$, and $V_{PV3}$ can be based on the value of the target threshold voltage of memory cell 213 of memory cell string 231. Between times T2 and T3, signal BL can have a voltage level corresponding to voltage V0 or voltage $V_{BL}$ (e.g., 0.5V) depending on the value of the threshold voltage of memory cell 213 of memory cell string 231. Between times T2 and T3, memory device 200 can read memory cell 213 of memory cell string 231 and compare the value (e.g., voltage value) of the threshold voltage of memory cell 213 of memory cell string 231 with the value (e.g., voltage value) of information 422 (e.g., voltage value based on the value of bits $B0_0$, $B1_0$, and $B2_0$) stored in blocks 291, 292, and 293. Based on the comparison, memory device 200 can determine whether memory cell 213 of memory cell string 231 has reached its target threshold voltage.

Between times T3 and T4, memory device 200 can determine whether memory cell 213 of memory cell string 431 has reached its target threshold voltage (e.g., whether $Vt_{213\_431}=2V$ in FIG. 5) after it was programmed by program loop X. Between times T3 and T4, signal $WL3_0$ can be provided with voltages $V_{PV4}$, $V_{PV5}$, and $V_{PV6}$ having different values to allow memory device 200 to determine whether memory cell 213 of memory cell string 431 has reached its target threshold voltage. The values of voltages $V_{PV4}$, $V_{PV5}$, and $V_{PV6}$ can be based on the value of the target threshold voltage of memory cell 213 of memory cell string 231. Some or all or voltages $V_{PV4}$, $V_{PV5}$, and $V_{PV6}$ can have values different from those of voltages $V_{PV1}$, $V_{PV2}$, and $V_{PV3}$. Between times T3 and T4, signal BL can have a voltage level corresponding to voltage V0 or voltage $V_{BA}$ (e.g., 0.5V) depending on the value of the threshold voltage of memory cell 213 of memory cell string 431. Between times T3 and T4, memory device 200 can read memory cell 213 of memory cell string 431 and compare the value (e.g., voltage value) of the threshold voltage of memory cell 213 of memory cell string 431 with the value (e.g., voltage value) of information 422 (e.g., voltage value based on the value of bits $B0_1$, $B1_1$, and $B2_1$) stored in blocks 291, 292, and 293. Based on the comparison, memory device 200 can determine memory cell 213 of memory cell string 431 has reached its target threshold voltage.

Thus, as shown in FIG. 6, memory device 200 can concurrently program (e.g., concurrently change the threshold voltages of) selected memory cells of different memory cell strings (e.g., memory cells 213 of memory cell strings 231 and 431) that are coupled to the same data line (e.g., line 270). The concurrent programming improves the write operation of memory device 200 in comparison with some conventional memory devices. For example, during a time interval similar to the time interval between times T0 and T1, some conventional memory devices may program a selected memory cell of only one memory cell string coupled to a data line (e.g., a data line similar to line 270). In memory device 200, by quickly storing information in memory cells 285 and by concurrently programming selected memory cells as described above with reference to FIG. 6, the overall amount of time to store (e.g., program) information in a given number of memory cells (e.g., memory cells 210, 211, 212, and 213) in memory device 200 can be less than the amount of time to store information in the same number of memory cells in some conventional memory devices. This allows memory device 200 to have a lower energy consumption to store a bit of information in memory cells 210, 211, 212, and 213 in comparison with some conventional memory devices, and a higher program throughput in comparison with some conventional memory devices.

Figure 7A:
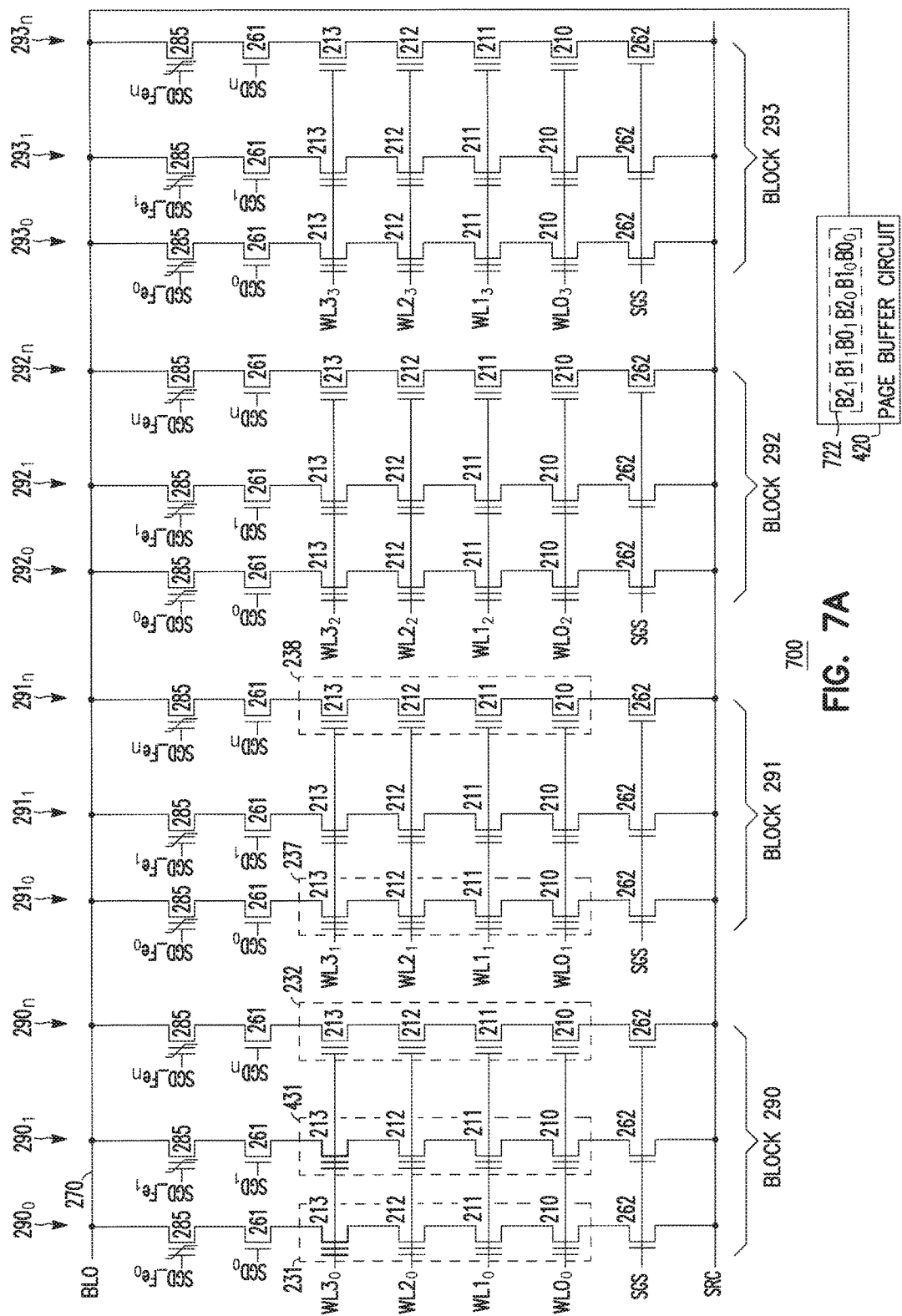

FIG. 7A shows a portion of memory device 200 of FIG. 2B including example information 722 to be stored in memory cells 210, 211, 212, and 213 of one of blocks 290, 291, 293, and 293 during an example write operation of memory device 700, according to some embodiments described herein. Memory device 700 includes elements similar to or the same as those of memory device 200 described above with reference to FIG. 2A through FIG. 6. Thus, for simplicity, similar or identical elements between memory devices 200 and 700 are given the same reference labels and their description and operation are not repeated.

The operations of memory device 700 are similar to the operations of memory device 200 described above with reference to FIG. 2A through FIG. 6. Differences in the operations between memory devices 200 and 700 include the locations in memory device 700 where information is temporarily stored before the information is stored in a selected block. As described above with reference to FIG. 4B, memory device 200 can temporarily store information in memory cells 285 of a deselected block (e.g., block 291, 292, and 293). As described below with reference to FIG. 7B, FIG. 7C, and FIG. 7D, memory device 700 can temporarily store information 722 in the pillars associated with memory cell strings of deselected blocks (e.g., blocks 291, 292, and 293).

As shown in FIG. 7A, information 722 can include bits (six bits) $B0_0$, $B1_0$, $B2_0$, $B0_1$, $B1_1$, and $B2_1$ that can be received at page buffer circuit 420 of memory device 700. In the example write operation associated with FIG. 7A, FIG. 7B, FIG. 7C, and FIG. 7D (described below), information 722 (e.g., bits $B0_0$, $B1_0$, $B2_0$, $B0_1$, $B1_1$, and $B2_1$) is assumed to be stored in selected memory cells among memory cells 210, 211, 212, and 213 of block 290. Thus, in this example, block 290 is a selected block, and blocks 291, 292, and 293 are deselected (unselected) blocks.

Figure 7B:
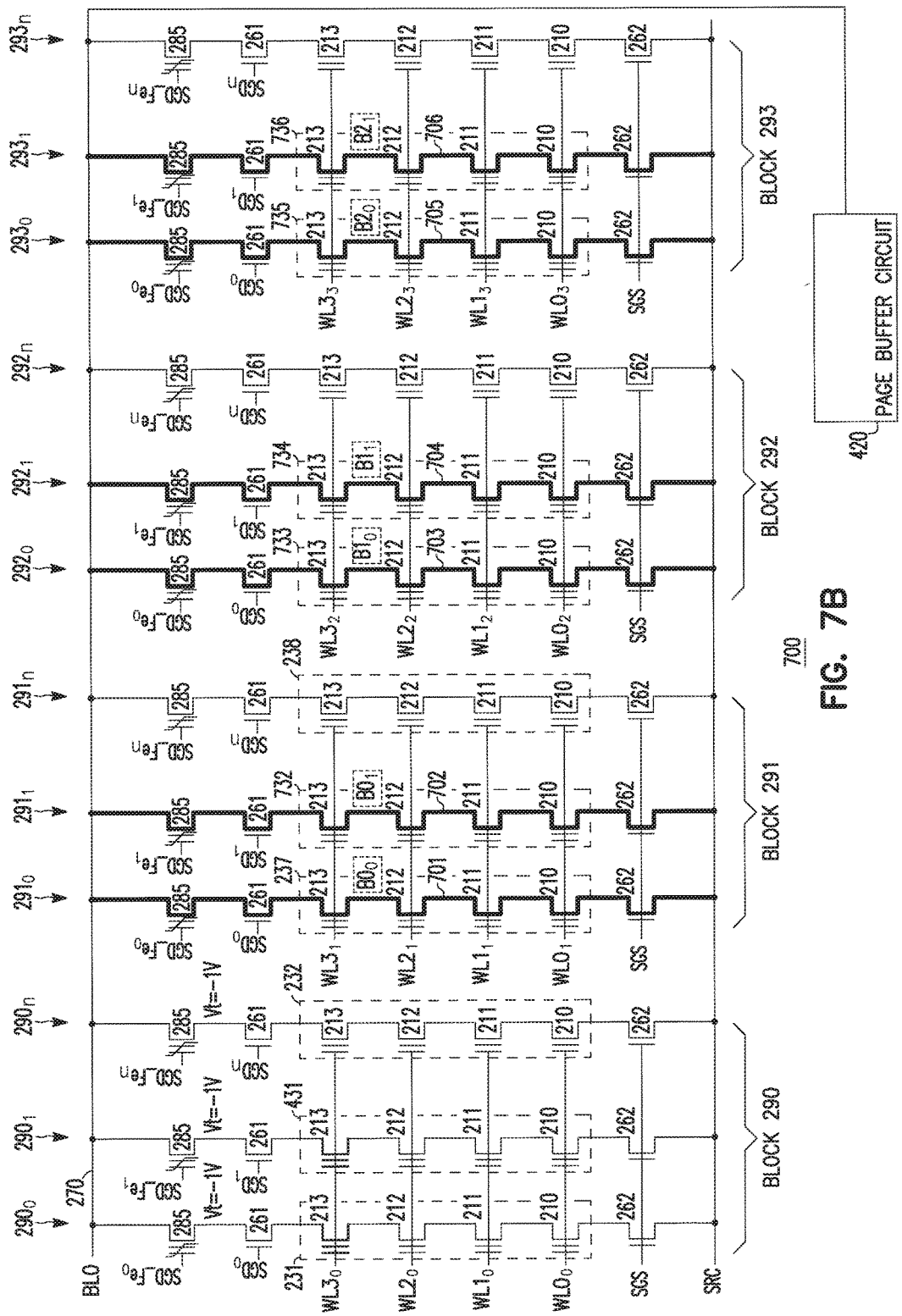

FIG. 7B shows blocks 291, 292, and 293 after bits $B0_0$, $B1_0$, $B2_0$, $B0_1$, $B1_1$, and $B2_1$ of information 722 (FIG. 7A) are stored (e.g., temporarily stored) in respective pillars 701, 702, 703, 704, 705, and 706 of blocks 291, 292, and 293

Figure 8:
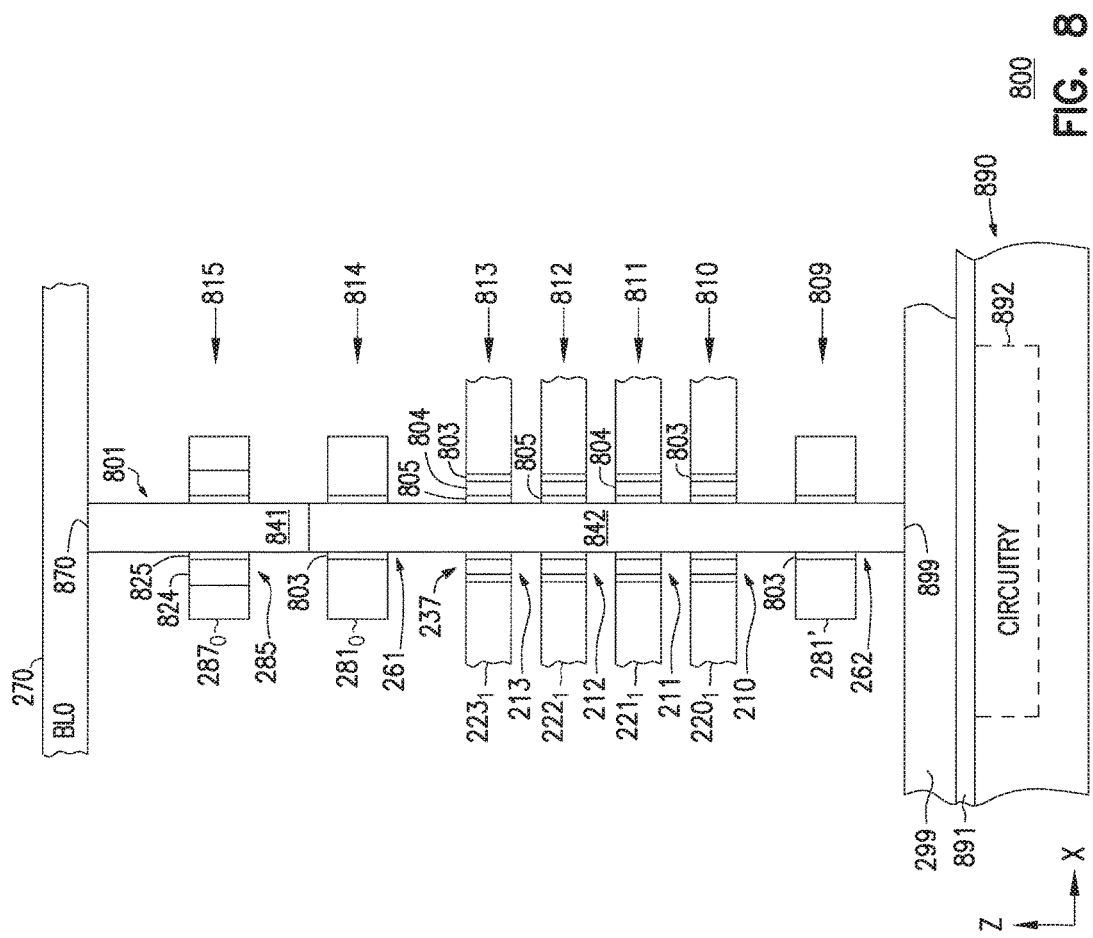
FIG. 8 shows a side view of a structure of a portion of a memory device including memory cells of different non-volatile memory cell types sharing the same pillar, according to some embodiments described herein.

(deselected blocks). FIG. 8 (described below) shows an example of a pillar associated with a memory cell string of a memory device. In the example associated with FIG. 7B, bits $B0_0$, $B0_1$, $B1_0$, $B1_1$, $B2_0$, and $B2_1$ can be stored in pillars 701 through 706, respectively, in a sequential fashion. Memory device 700 can cause the potential of pillars 701 through 706 to have voltage values to represent the values of bits $B0_0$, $B0_1$, $B1_0$, $B1_1$, $B2_0$, and $B2_1$ stored therein. For example, if bits $B0_0$, $B0_1$, $B1_0$, $B1_1$, $B2_0$, and $B2_1$ of information 722 (FIG. 7A) have values (binary values) 100101, respectively, then memory device 700 can cause the potentials of pillars 701, 702, 703, 704, 705, and 706 to have voltage values of 2V, 0V, 0V, 2V, 0V, and 2V, respectively. Voltage values of 0V and 2V are used to represent binary values of 0 and 1, respectively, as an example. Other voltage values can be used to represent binary 0 and 1.

The potential of a particular pillar among pillars 710 through 706 can be based on the capacitive coupling (e.g., capacitance) between that particular pillar and a combination of control lines and source and drain select lines associated with that particular pillar. For example, in FIG. 7B, to cause pillar 701 to have a potential of 0V (e.g., if bit $B0_0$ stored in pillar 701 is binary 0), memory device 700 can provide a voltage of 0V to signal $SGD\_Fe_0$ of block 291, a positive voltage (e.g., 6V) to signals $WL0_1$, $WL1_1$, $WL2_1$, and $WL3_1$, $SGD_0$, and SGS of block 291, and a voltage of 0V to signal BL0. In another example, in FIG. 7B, to cause pillar 701 to have a potential of 2V (if bit $B0_0$ stored in pillar 701 is binary 1), memory device 700 can provide a voltage of 0V to signal $SGD\_Fe_0$ of block 291, a positive voltage (e.g., 6V) to signals $WL0_1$, $WL1_1$, $WL2_1$, and $WL3_1$, $SGD_0$, and SGS of block 291, and a voltage of 2V to signal BL0. As described above, bits $B0_0$, $B0_1$, $B1_0$, $B1_1$, $B2_0$, and $B2_1$ can be stored in pillars 701 through 706, respectively, in a sequential fashion. Thus, memory device 700 may activate (e.g., by applying 6V) signals $SGD_0$, $SGD_1$, and $SGD_n$ one at a time and one deselected block at a time in order to store bits $B0_0$, $B0_1$, $B1_0$, $B1_1$, $B2_0$, and $B2_1$ in respective pillars 701 through 706 one bit at a time.

FIG. 7B also shows a threshold voltage (Vt) and its associated value (e.g., $_1$ volt (1V)) of memory cells 285 of block 290 (selected block). Similar to the write operation of memory device 200 (FIG. 4B), memory device 700 in FIG. 7B may not use memory cells 285 of block 290 (selected block) to store information. However, memory device 700 can control the threshold voltage (e.g., state) of each of memory cells 285 of block 290 when memory device 700 stores information (e.g., based on information 722 in FIG. 7A) in selected memory cells 210, 211, 212, and 213 of block 290. For example, memory device 200 can cause threshold voltage Vt of memory cell 285 coupled to memory cell string 231 to be at one value (e.g., Vt=−1V) if the selected memory cell (one of memory cells 210, 211, 212, and 213) in memory cell string 231 has not reached its target threshold voltage (e.g., one of $Vt_0$ through $Vt_7$ in FIG. 3C and FIG. 3D). In another example, memory device 200 can cause threshold voltage Vt of memory cell 285 coupled to memory cell string 231 to be at another value (e.g., Vt=+1V) if the selected memory cell in memory cell string 231 has reached its target threshold voltage (e.g., one of $Vt_0$ through $Vt_7$ in FIG. 3D). FIG. 7B shows Vt=−1 in memory cells 285 of block 290 to illustrate an example where selected memory cells of block 290 have not reached their respective threshold voltage values. The operation of memory device 700 to store information in memory cells 210, 211, 212, and 213 of block 290 (after bits $B0_0$, $B1_0$, $B2_0$, $B0_1$, $B1_1$, and $B2_1$ are stored in respective pillars 701 through 706) is similar to that of the operation of memory device 200 that stores information in memory cells 210, 211, 212, and 213 of block 290 (FIG. 4B, FIG. 4C, and FIG. 4C)

FIG. 7C shows block 290 after information (bits $B0'_0$, $B1'_0$, and $B2'_0$) is stored in memory cell 213 of memory cell string 231 of sub-block $290_0$. The value of the combination of bits $B0'_0$, $B1'_0$, and $B2'_0$ stored in memory cell 213 of memory cell string 231 is based on (e.g., is the same as) the value of the combination of bits $B0_0$, $B1_0$, $B2_0$ stored in pillars 701, 703, and 705 of blocks 291, 292, and 293 (deselected blocks), respectively, of FIG. 7B. For example, if the potentials of pillars 701, 703, and 705 are 2V, 0V, and 0V, respectively, then the values of bits $B0'_0$, $B1'_0$, and $B2'_0$ stored in memory cell 213 of memory cell string 23 can be "100", respectively.

Similar to the write operation of memory device 200 (associated with FIG. 4C), after memory device 700 in FIG. 7C stores bits $B0'_0$, $B1'_0$, and $B2'_0$ in memory cell 213 of memory cell string 231 (which is after memory cell 213 of memory cell string 231 has reached its target threshold voltage), memory device 700 can cause the value of threshold voltage Vt of memory cell 285 (coupled to memory cell string 231) to change from −1V to +1V (as shown in FIG. 7C). This prevents memory cell 213 of memory cell string 231 (which stores bits $B0'_0$, $B1'_0$, and $B2'_0$) from being programmed in the next programming loop.

FIG. 7D shows block 290 after information (bits $B0'_1$, $B1'_1$, $B2'_1$) is stored in memory cell 213 of memory cell string 431 of sub-block $290_1$. The value of the combination of bits $B0'_1$, $B1'_1$, and $B2'_1$ stored in memory cell 213 of memory cell string 431 is based on (e.g., is the same as) the value of the combination of bits $B0_1$, $B1_1$, $B2_1$ stored in pillars 702, 704, and 706 of blocks 291, 292, and 293 (deselected blocks) of FIG. 7B. For example, if the potentials of pillars 702, 704, and 706 are 2V, 0V, and 2V, respectively, then the values of bits $B0'_1$, $B1'_1$, and $B2'_1$ memory cell 213 of memory cell string 431 can be "101", respectively.

Similar to storing information (e.g., bits $B0'_0$, $B1'_0$, $B2'_0$) in memory cell 213 of memory cell string 231 (FIG. 7C), after memory device 700 (FIG. 7D) stores bits $B0'_1$, $B1'_1$, $B2'_1$ in memory cell 213 of memory cell string 431 (which is after memory cell 213 of memory cell string 431 has reached its target threshold voltage), memory device 700 can cause the value of threshold voltage Vt of memory cell 285 (coupled to memory cell string 431) to change from −1V to +1V (as shown in FIG. 7D). This prevents memory cell 213 of memory cell string 431 (which has reached its target threshold voltage) from being further programmed in a next program loop.

FIG. 8 shows a side view of a structure of a portion of memory device 800 including memory cells of different non-volatile memory cell types sharing the same pillar, according to some embodiments described herein. The structure of memory device 800 can be used as an example structure of memory device 200 or memory device 700 described above with reference to FIG. 2A through FIG. 7D. Thus, for simplicity, similar or identical elements between memory device 800 and memory devices 200 and 700 are given the same reference numbers.

As shown in FIG. 8, memory device 800 can include a substrate 890, which can include a monocrystalline (also referred to as single-crystal) semiconductor material. For example, substrate 890 can include monocrystalline silicon (also referred to as single-crystal silicon). The monocrystalline semiconductor material of substrate 890 can include impurities, such that substrate 890 can have a specific conductivity type (e.g., n-type or p-type).

Memory device 800 can include circuitry 892 formed in substrate 890, and material (e.g., isolation material, such as a dielectric material) 891 between line 299 and circuitry 892. Circuitry 892 can include sense amplifiers and page buffer circuits (e.g., page buffer circuit 420 of FIG. 4A and FIG. 7A). Other components of memory device 800 (e.g., memory cells, select gates, control lines, and pillar described below) can be formed (e.g., formed vertically) over substrate 890 and over circuitry 892.

As shown in FIG. 8, memory device 800 includes different levels 809 through 815 with respect to a z-dimension. The z-dimension can extend in a direction of the thickness of substrate 890. FIG. 8 also shows an x-dimension, which is perpendicular to the z-dimension. Levels 809 through 815 are internal levels of memory device 800 between substrate 890 and line 270. Memory cells 210, 211, 212, and 213 can be located in levels 810, 811, 812, and 813, respectively (e.g., arranged vertically in the z-dimension with respect to substrate 890). Line 270 can include a conductive material and have a length extending in the x-dimension. Line 299 can have a length extending in the x-dimension. FIG. 8 shows an example where line 299 (e.g., source) can be formed over a portion of substrate 890 (e.g., by depositing a conductive material over substrate 890). Alternatively, line 299 can be formed in or formed on a portion of substrate 890 (e.g., by doping a portion of substrate 890).

Memory device 200 can include a pillar (e.g., a vertical column of conductive materials) 801 formed over substrate 890, such that circuitry 892 can be under (e.g., directly under) pillar 801. Pillar 801 can extend between and contact (e.g., can be directly coupled to) a conductive material region 870 and a conductive material region 899. Conductive material region 870 is part of the conductive material of line (e.g., data line) 270. Conductive material region 899 is part of line (e.g., source) 299. Pillar 801 has a length extending outwardly (e.g., vertically) from substrate 890 in the z-dimension (extending between line 270 and line 299). As shown in FIG. 8, circuitry 892 is formed in substrate 890 under pillar 801. Pillar 801 is schematically shown in FIG. 7B as pillar 701. Each of pillar 702 through 706 of FIG. 7B can have a structure similar to (or identical to) the structure of pillar 801 of FIG. 8.

Pillar 801 can include conductive materials that can conduct a current between line 270 and line (e.g., source) 299. Pillar 801 can include portions (conductive portions) 841 and 842. Portions 841 and 842 can include materials of different conductivity types. For example, portion 841 can include a semiconductor material of n-type (e.g., conductively doped polycrystalline silicon of n-type), and portion 842 can include a semiconductor material of p-type (e.g., conductively doped polycrystalline silicon of p-type).

As shown in FIG. 8, memory cell 285 can share pillar 801 with memory cell string 237. Memory cell 285 includes portions 824 and 825 between a segment of pillar 801 and line 287$_0$. Portion 824 includes a structure (e.g., a memory portion) that can be configured to store information. Line 287$_0$ can include conductive material (e.g., conductively doped polycrystalline silicon, metals, or other conductive materials). As shown in FIG. 8, memory cell 285 and line 287$_0$ can be located along the same segment (e.g., segment at level 815) of pillar 801.

Memory cell 285 can be one of memory cells 285 of memory device 200 or memory device 700. For example, memory cells 285 can include ferroelectric memory cells or other non-volatile memory cell types. In the example structure of FIG. 8, portions 824 and 825 of memory cell 285 can be part of a ferroelectric memory cell. For example, portion 825 can include an oxide material (e.g., hafnium aluminum oxide (HfAlO) or other oxide material), and portion 824 can include a ferroelectric material (e.g., lead zirconate titanate (PZT), $SrBiO_2Ta_2O_9$, or other ferroelectric materials) that is capable of storing information. In another example, portion 824 can include non-silicon materials (material excluding silicon). Examples of such non-silicon materials include phase change materials (e.g., $Ge_2Sb_2Te_5$ (GST) and other non-silicon materials.

As shown in FIG. 8, control lines 220$_1$, 221$_1$, 222$_1$, 223$_1$ associated with respective memory cells 210, 211, 212, and 213 can be located in levels 810, 811, 812, and 813, respectively, along a segment (e.g., the segment extending from level 810 to level 813) of pillar 801. The materials of control lines 220$_1$, 221$_1$, 222$_1$, and 223$_1$ can include a conductive material (e.g., conductively doped polycrystalline silicon of n-type, metals, or other conductive materials). Select line 281$_0$ (e.g., drain select line) and associated select gate 261 can be located along a segment (e.g., the segment at level 814) of pillar 801. Select line 281' (e.g., source select line) and associated select gate 262 can be located along a segment (e.g., the segment at level 809) of pillar 801. The materials of select line 281$_0$ and select line 281' can be the same or can be different. Examples of the conductive material of select line 281$_0$ and select line 281' include conductively doped polycrystalline silicon, metals, or other conductive materials.

Memory cell string 237 can include portions 803, 804, 805 between a segment of pillar 801 and each of control lines 220$_1$, 221$_1$, 222$_1$, and 223$_1$. Portion 803 can also be between a portion of pillar 801 and each of select gates 261 and 262. As shown in FIG. 8, portions 803, 804, and 805 can be vertically separated (e.g., separated by dielectric material) among memory cells 210, 211, 212, and 213. In an alternative arrangement, portions 803, 804, and 805 are not separated (e.g., are continuous) among memory cells 210, 211, 212, and 213 but can be continuously formed (e.g., continuously formed between levels 810 and 813). For example, in the alternative arrangement, portions 803, 804, and 805 can be part of a TANOS (TaN, $Al_2O_3$, $Si_3N_4$, $SiO_2$, Si) structure or a SONOS (Si, $SiO_2$, $Si_3N_4$, $SiO_2$, Si) structure. In such an alternative arrangement, portions 803, 804, and 805 can be formed by a process such as a damascene process.

In FIG. 8, portions 803 and 804 can have different materials. Portion 803 can include a charge blocking material(s) (e.g., a dielectric material such as silicon nitride) that is capable of blocking a tunnel of a charge. In each of memory cell 210, 211, 212, and 213, portion 804 includes a structure (e.g., a charge storage structure) configured to store information (e.g., store multiple bits of information). Portions 824 of memory cell 285 and portion 804 of each of memory cells 210, 211, 212, and 213 can include different materials. Portion 804 can include a charge storage material(s) that can provide a charge storage function to represent a value of information stored in memory cells 210, 211, 212, and 213. For example, portion 804 can include doped polycrystalline silicon (which can be either a p-type polycrystalline silicon or an n-type polycrystalline silicon) that can be configured to operate as a floating gate (e.g., to store charge) in a memory cell 210, 211, 212, or 213 to store information. In another example, portion 804 can include a charge trap material (e.g., a dielectric material (e.g., $Si_3N_4$)) that operates as a charge trap in memory cell 210, 211, 212, or 213 to store information. Portion 805 can include a tunnel dielectric material or materials (e.g., SiO$_2$) that is capable of allowing tunneling of a charge (e.g., electrons). As an example, portion 805 can allow tunneling of electrons from portion 842 to portion 804 during a write operation and tunneling of electrons from portion 804 to portion 842 during an erase operation of memory device 800.

FIG. 8 shows an example where select gates 261 and 262 have structures that are different from the structures of memory cells 210, 211, 212, and 213. Alternatively, select gates 261 and 262 can have structures similar to or the same as the structures of memory cells 210, 211, 212, and 213.

FIG. 8 shows an example of memory device 800 where select gate 261 is between memory cell 285 and memory cell string 237. Alternatively, memory cell 285 can be located between select gate 261 and memory cell string 237.

As described above, the structure of memory device 800 can be used as the structure for memory device 200 (FIG. 4A). For example, during a write operation, memory device 800 can operate to temporarily store information (e.g., in the form of charge in a capacitor formed by portion 824) in memory cell 285 if the block that includes memory cell string 237 is a deselected block (e.g., block 291 in FIG. 4B). Memory device 800 can operate to control the threshold voltage of memory cell 285 if the block that includes memory cell string 237 is a selected block.

As described above, the structure of memory device 800 can be used as the structure for memory device 700 (FIG. 7A). For example, during a write operation, memory device 800 can operate to temporarily store information (e.g., in the form of charge) in pillar 801 if the block that includes memory cell string 237 is a deselected block (e.g., block 291 in FIG. 7B). Memory device 800 can operate to control the threshold voltage of memory cell 285 if the block that includes memory cell string 237 is a selected block.

Figure 9:
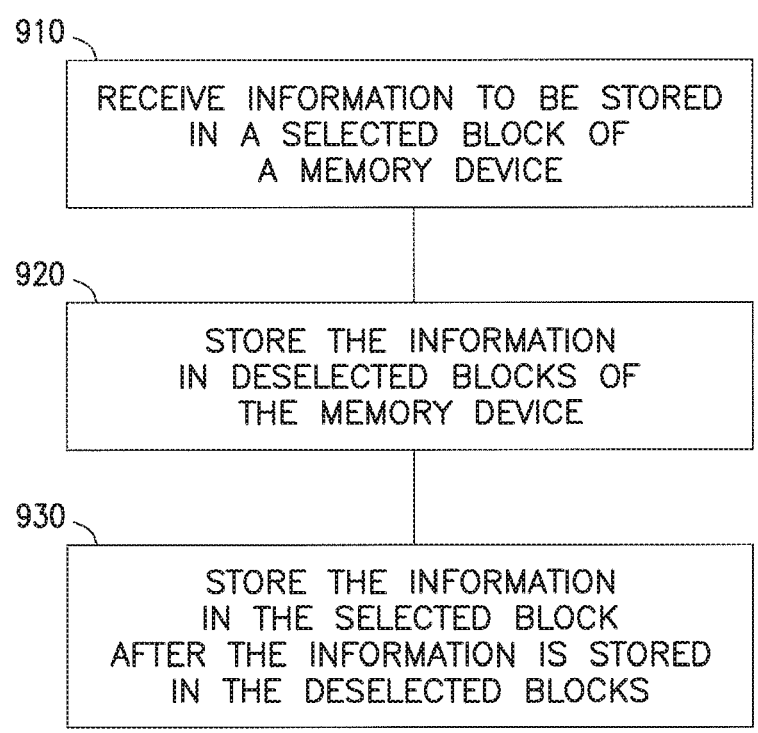
FIG. 9 is a flowchart for a method of operating a memory device, according to some embodiments described herein.

FIG. 9 shows a method 900 of operating a memory device, according to some embodiments described herein. The memory device used in method 900 can be memory device 200, memory device 700, or memory device 800. Method 900 can be implemented in software, firmware, or hardware, or any combination of software, firmware, or hardware. For example, the software, firmware, or hardware, or any combination of software, firmware, or hardware that perform method 900 can be part of a control unit of the memory device used in method 900. A portion of method 900 or the entire method 900 can be part of an algorithm implemented in such a control unit of the memory device used in method 900.

As shown in FIG. 9, method 900 can include activities 910, 920, and 930. Activity 910 can include receiving information to be stored in a portion of the memory device. The portion can include a selected block (e.g., block 290 of FIG. 4A or FIG. 7A) among blocks (e.g., blocks 290, 291, 292, and 293 of FIG. 4A or FIG. 7A) of the memory device. The information in activity 910 can include information 422 (FIG. 4A) or information 722 (FIG. 7A).

Activity 920 can include storing (e.g., programming) the information in another portion of the memory that can include deselected blocks (e.g., blocks 291, 292, and 293 of FIG. 4A or FIG. 7A) of the memory device. Activity 920 may store (e.g., temporarily store) the information in the memory cells (e.g., memory cells 285 in FIG. 4B) of the deselected blocks (e.g., blocks 291, 292, and 293 in FIG. 4B). Alternatively, activity 920 may store (e.g., temporarily store) the information in pillars (e.g., pillars 701 through 706 in FIG. 7B) associated with memory cells (e.g., memory cells 210, 211, 212, and 213) of the deselected blocks (e.g., blocks 291, 292, and 293 in FIG. 7B). The information in activities 910 and 920 can include different portions (e.g., pages) of bits.

Activities 910 and 920 may receive and store the portions of the information in deselected blocks in a sequential fashion. For example, activity 910 may receive (e.g., load) a first portion of the information in a page buffer circuit of the memory device, and activity 920 may store the first portion of the information in the deselected blocks. Then, activity 910 may receive a second portion of the information in the page buffer circuit and activity 920 may store the second portion of the information in the deselected blocks (after the first portion is stored in the deselected blocks). Activities 910 and 920 can repeat the process until all portions of the information (to be stored in a selected block) are received and stored in the deselected blocks. Method 900 can continue with activity 930 after the information is stored in the deselected blocks.

Activity 930 can include storing (e.g., programming) information in memory cells (e.g., memory cells 210, 211, 212, and 213) of the selected block. The value of the information stored in the selected block is based on the value of the information stored in the deselected blocks in activity 920. In activity 930, storing the information in the selected block can include concurrently changing the threshold voltages of selected memory cells of different memory cell strings that are coupled to the same data line (e.g., line 270 in FIG. 4A or FIG. 7A) of the memory device. During storing information in the selected memory cells, activity 930 can include concurrently activating (e.g., applying a positive voltage to select lines (e.g., drain select lines) select gates associated with memory cell strings of the selected memory cells that share the same data line (e.g., line 270 in FIG. 4A or FIG. 7A). The selected block can include additional memory cells similar to memory cells 285 (FIG. 4A or FIG. 7A). During storing information in the selected memory cells, activity 930 can include controlling threshold voltages of the additional memory of the selected block. Controlling the threshold voltages can include causing the threshold voltages of the additional memory cells (e.g., memory cells 285) of the selected block to change or to remain the same based on whether the selected memory cells (e.g., memory cells 210, 211, 212, and 213) of the selected block have reached their respective target threshold voltage values.

Method 900 described above can include fewer or more activities relative to activities 910, 920, and 930 shown in FIG. 9. For example, method 900 can include activities and operations of memory device 100, 200, 700, or 800 described above with reference to FIG. 1 through FIG. 8.

The illustrations of apparatuses (e.g., memory devices 100, 200, 700, and 800) and methods (e.g., operating methods associated with memory devices 100, 200, 700, and 800, and method 900) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, and 800) or a system (e.g., a computer, a cellular phone, or other electronic systems) that includes a device such as any of memory devices 100, 200, 700, and 800.

Any of the components described above with reference to FIG. 1 through FIG. 9 can be implemented in a number of ways, including simulation via software. Thus, apparatuses (e.g., memory devices 100, 200, 700, and 800 or part of each of these memory devices, including a control unit in these memory devices, such as control unit 118 (FIG. 1)) described above may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 700, and 800 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 9 include apparatuses, and methods of forming and operating the apparatuses. Some of the apparatuses include a conductive line, non-volatile memory cells of a first memory cell type, the non-volatile memory cells coupled in series among each other, and an additional non-volatile memory cell of a second memory cell type coupled to the conductive line and coupled in series with the non-volatile memory cells of the first memory cell type. The second memory cell type is different from the first memory cell type. Other embodiments including additional apparatuses and methods are described.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a data line;
   a first plurality of sub-blocks coupled to the data line, each sub-block of the first plurality of sub-blocks including memory cell strings;
   a second plurality of sub-blocks coupled to the data line, each sub-block of the second plurality of sub-blocks including memory cell strings;
   a buffer circuit to receive first information; and
   a control unit to store second information in the first plurality of sub-blocks and to store third information in the second plurality of sub-blocks, wherein a value of the second information is based on a value of the first information received at the buffer circuit, and a value of the third information is based on the value of the second information.

2. The apparatus of claim 1, wherein each sub-block of each of the first and second pluralities of sub-blocks includes memory cells having different memory cell types.

3. The apparatus of claim 1, wherein the first plurality of sub-blocks includes memory cells having a first memory cell type, the second plurality of sub-blocks includes memory cells having a second memory cell type different from the first memory cell type, and the control unit is configured to store the second information in the memory cells having the first memory cell type, and to store the third information in the memory cells having the second memory cell type.

4. The apparatus of claim 1, wherein the first plurality of sub-blocks includes pillars associated with the memory cell strings of the first plurality of sub-blocks, and the control unit is configured to store the second information having a value based on potentials of the pillars.

5. The apparatus of claim 1, wherein the second plurality of sub-blocks includes:
   a first sub-block and a second sub-block;
   a first select gate coupled between the data line and the first sub-block; and
   a second select gate coupled between the data line and the second sub-block, and the control unit is configured to concurrently activate the first and second select gates during an operation of storing the third information in the second plurality of sub-blocks.

6. The apparatus of claim 1, further comprising first access lines and second access lines separated from the first access lines, wherein the first plurality of sub-blocks shares the first access lines, and the second plurality of sub-blocks shares the second access lines.

7. The apparatus of claim 1, wherein each sub-block of each of the first and second pluralities of sub-blocks includes:
   first memory cells having a first memory cell type; and
   a second memory cell having a second memory cell type, and each of the first memory cells is configured to store more bits of information than the second memory cell.

8. The apparatus of claim 7, wherein each of the first memory cells includes a charge storage structure configured to store information, and the charge storage structure is polysilicon.

9. The apparatus of claim 7, wherein each of the first memory cells includes a charge storage structure configured to store information, and the charge storage structure is silicon nitride.

10. The apparatus of claim 7, wherein the second memory cell includes a ferroelectric material.

11. An apparatus comprising:
    a conductive line;
    a first memory cell block including first sub-blocks coupled to the conductive line, each of the first sub-blocks including a first memory cell string and a first additional memory cell, the first memory cell string including first memory cells coupled in series with the first additional memory cell;
    a second memory cell block including second sub-blocks coupled to the conductive line, each of the second sub-blocks including a second memory cell string and a second additional memory cell, the second memory cell string including second memory cells coupled in series with the second additional memory cell, wherein the first memory cells and the second memory cells have a first memory cell type, and the first and second additional memory cells have a second memory type;
first access lines coupled to the first memory block; and
second access lines coupled to the second memory cell block, the second access lines being separated from the first access lines.

12. The apparatus of claim 11, further comprising an additional conductive line coupled to each of the first sub-blocks and each of the second sub-blocks, wherein:
each of the first sub-blocks and each of the second sub-blocks includes a memory cell string and an additional memory cell;
the memory cell string includes memory cells coupled in series with the additional memory cell; and
the memory cells have the first memory cell type, and the additional memory cell has the second memory type.

13. The apparatus of claim 12, wherein:
the memory cell string of the first sub-blocks shares the first access lines with the first memory cell string of the first sub-blocks; and
the memory cell string of the second sub-blocks shares the second access lines with the second memory cell string of the second sub-blocks.

14. The apparatus of claim 13, further comprising:
a first select gate coupled between the first additional memory cell and the first memory cell string of the first sub-blocks;
a second select gate coupled between the second additional memory cell and the second memory cell string of the second sub-blocks;
a third select gate coupled between the additional memory cell of the first sub-blocks and the memory cell string of the first sub-blocks;
a fourth select gate coupled between the additional memory cell of the second sub-blocks and the memory cell string of the second sub-blocks.

15. The apparatus of claim 13, further comprising:
a first additional select gate coupled between the first memory cell string of the first sub-block and a source;
a second additional select gate coupled between the second memory cell string of the second sub-blocks and the source;
a third additional select gate coupled between the memory cell string of the first sub-blocks and the source;
a fourth additional select gate coupled between the memory cell string of the second sub-blocks and the source.

16. A method comprising:
receiving first information;
storing the first information in a first portion of a memory device, the first portion of the memory device including a first plurality of memory cells coupled to a data line, the first plurality of memory cells having a first non-volatile memory cell type; and
storing second information in a second portion the memory device after the first information is stored in the first portion of the memory device, the second information having a value based on a value of the first information stored in the first portion of the memory device, the second portion of the memory device including a second plurality of memory cells coupled to the data line, and the second plurality of memory cells having a second non-volatile memory cell type different from the first non-volatile memory cell type.

17. The method of claim 16, wherein storing the second information includes:
changing a threshold voltage of a memory cell of the second plurality of memory cells; and
determining whether the threshold voltage of the memory cell reaches a target threshold voltage based on the value of the first information stored in the first portion of the memory device.

18. The method of claim 16, wherein storing the first information includes:
storing in a first memory cell of the first plurality of memory cells only one bit among a plurality of bits included in the first information; and
storing in a second memory cell of the first plurality of memory cells only one bit among the plurality of bits included in the first information.

19. The method of claim 16, wherein storing the first information includes:
changing the potential of a pillar associated with a portion of the first plurality of memory cells, such that a value of a bit of the first information is based on a value of the potential of the pillar.

20. The method of claim 16, wherein storing the second information includes:
storing in a first memory cell of the second plurality of memory cells first multiple bits among a plurality of bits included in the second information; and
storing in a second memory cell of the second plurality of memory cells second multiple bits among the plurality of bits included in the second information.

* * * * *